(12) United States Patent
Payne et al.

(10) Patent No.: US 12,405,534 B2
(45) Date of Patent: Sep. 2, 2025

(54) MEMS BASED SPATIAL LIGHT MODULATORS WITH IMPROVED THERMAL CONTROL

(71) Applicant: SILICON LIGHT MACHINES CORPORATION, San Jose, CA (US)

(72) Inventors: Alexander Payne, Ben Lommond, CA (US); Gregory Jacob, Santa Clara, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 713 days.

(21) Appl. No.: 17/591,834

(22) Filed: Feb. 3, 2022

(65) Prior Publication Data
US 2022/0252866 A1    Aug. 11, 2022

Related U.S. Application Data

(60) Provisional application No. 63/146,488, filed on Feb. 5, 2021.

(51) Int. Cl.
*G03F 7/00* (2006.01)
*B81B 7/00* (2006.01)
(Continued)

(52) U.S. Cl.
CPC ........ *G03F 7/70291* (2013.01); *B81B 7/0041* (2013.01); *G02B 26/001* (2013.01);
(Continued)

(58) Field of Classification Search
CPC ............. G03F 7/70291; G03F 7/70191; B81B 7/0041; B81B 2201/04; G02B 26/001;
(Continued)

(56) References Cited

U.S. PATENT DOCUMENTS

| 5,459,610 A | 10/1995 | Bloom et al. |
| 7,064,883 B2 | 6/2006 | Payne et al. |

(Continued)

OTHER PUBLICATIONS

International Search Report for International Application PCT/US22/15334 May 13, 2022.
(Continued)

*Primary Examiner* — James C. Jones
(74) *Attorney, Agent, or Firm* — William Nuttle

(57) ABSTRACT

Microelectromechanical systems (MEMS) based spatial light modulators (SLMs) enclosed in a package filled with a gas to enhance the reliability and lifetime of the SLM, and methods for operating the same in various applications are described. Generally, the SLM includes a number of MEMS modulators, each including a number of light reflective surfaces, at least one light reflective surface coupled to an electrostatically deflectable element suspended above a substrate, and each adapted to reflect and modulate a light beam incident thereon. The package enclosing the SLM includes an optically transparent cover through which the reflective surfaces are exposed to the light beam, and a cavity is filled a low molar mass fill gas having an atomic number of two or less and a thermal conductivity of greater than 100 mW/(m·K). The SLM can include electrostatically deflectable ribbons suspended over a substrate, or a linear array of two-dimensional MEMS modulators.

19 Claims, 19 Drawing Sheets

(51) Int. Cl.
  *G02B 26/00* (2006.01)
  *G02B 26/02* (2006.01)
  *G02B 26/08* (2006.01)
(52) U.S. Cl.
  CPC ....... *G02B 26/023* (2013.01); *G02B 26/0808* (2013.01); *G02B 26/0841* (2013.01); *G03F 7/70191* (2013.01); *B81B 2201/04* (2013.01)
(58) Field of Classification Search
  CPC .............. G02B 26/023; G02B 26/0808; G02B 26/0841; Y02P 10/25
  See application file for complete search history.

(56) References Cited

U.S. PATENT DOCUMENTS

| | | | |
|---|---|---|---|
| 7,227,687 B1 | 6/2007 | Trisnadi et al. | |
| 7,277,110 B2 | 10/2007 | Zarem et al. | |
| 8,767,170 B2 | 7/2014 | Sano et al. | |
| 11,016,287 B2 | 5/2021 | Payne et al. | |
| 11,036,030 B2 | 6/2021 | Lee | |
| 2005/0012197 A1* | 1/2005 | Smith | B81B 7/0061 257/687 |
| 2008/0239454 A1* | 10/2008 | Ichikawa | G02B 26/0841 359/290 |
| 2009/0128935 A1 | 5/2009 | Nishino et al. | |
| 2018/0307039 A1* | 10/2018 | Payne | G02B 26/0841 |
| 2020/0049820 A1* | 2/2020 | Choi | G01S 7/51 |
| 2020/0247052 A1* | 8/2020 | Payne | B23K 26/066 |

OTHER PUBLICATIONS

Written Opinion of International Searching Authority Application PCT/US22/15334 May 13, 2022.
Supplementary European Search Report for Application 22750476.8-1001 / 4288824 PCT/US22/15334 Dec. 6, 2024.

* cited by examiner

```
                                    1002

┌─────────────────────────────────────────────────────────────────────┐
    │  Providing A MEMS Based Spatial Light Modulator Including Reflective │
    │  Surfaces Enclosed Within A Cavity Of A Package Including An         │
    │  Optically Transparent Cover                                         │
    └─────────────────────────────────────────────────────────────────────┘
                                       │
                                       ▼
                                    1004

┌─────────────────────────────────────────────────────────────────────┐
    │  Filling The Cavity With A Low Molar Mass Fill Gas Having An Atomic  │
    │  Number Of Two Or Less And A Thermal Conductivity Of Greater Than    │
    │  100 mW/(m.K), At A Pressure Of 0.1 Atmospheres Or Greater           │
    └─────────────────────────────────────────────────────────────────────┘
                                       │
                                       ▼
                                    1006

┌─────────────────────────────────────────────────────────────────────┐
    │  Establishing A Fluid Flow In The Cavity Through An Inlet And An    │
    │  Outlet In The Package                                               │
    └─────────────────────────────────────────────────────────────────────┘
                                       │
                                       ▼
                                    1008

┌─────────────────────────────────────────────────────────────────────┐
    │  Exposing The Reflective Surface To A Light Beam Through The         │
    │  Optically Transparent Cover                                         │
    └─────────────────────────────────────────────────────────────────────┘
                                       │
                                       ▼
                                    1010

┌─────────────────────────────────────────────────────────────────────┐
    │  Monitoring Pressure in The Cavity During Exposure Of The Reflective │
    │  Surface To The Light Beam                                           │
    └─────────────────────────────────────────────────────────────────────┘
                                       │
                                       ▼
                                    1012

┌─────────────────────────────────────────────────────────────────────┐
    │  Stopping Exposure Of The Reflective Surface To The Light Beam If    │
    │  The Pressure Drops Below A Specified Minimum                        │
    └─────────────────────────────────────────────────────────────────────┘
```

*FIG. 10*

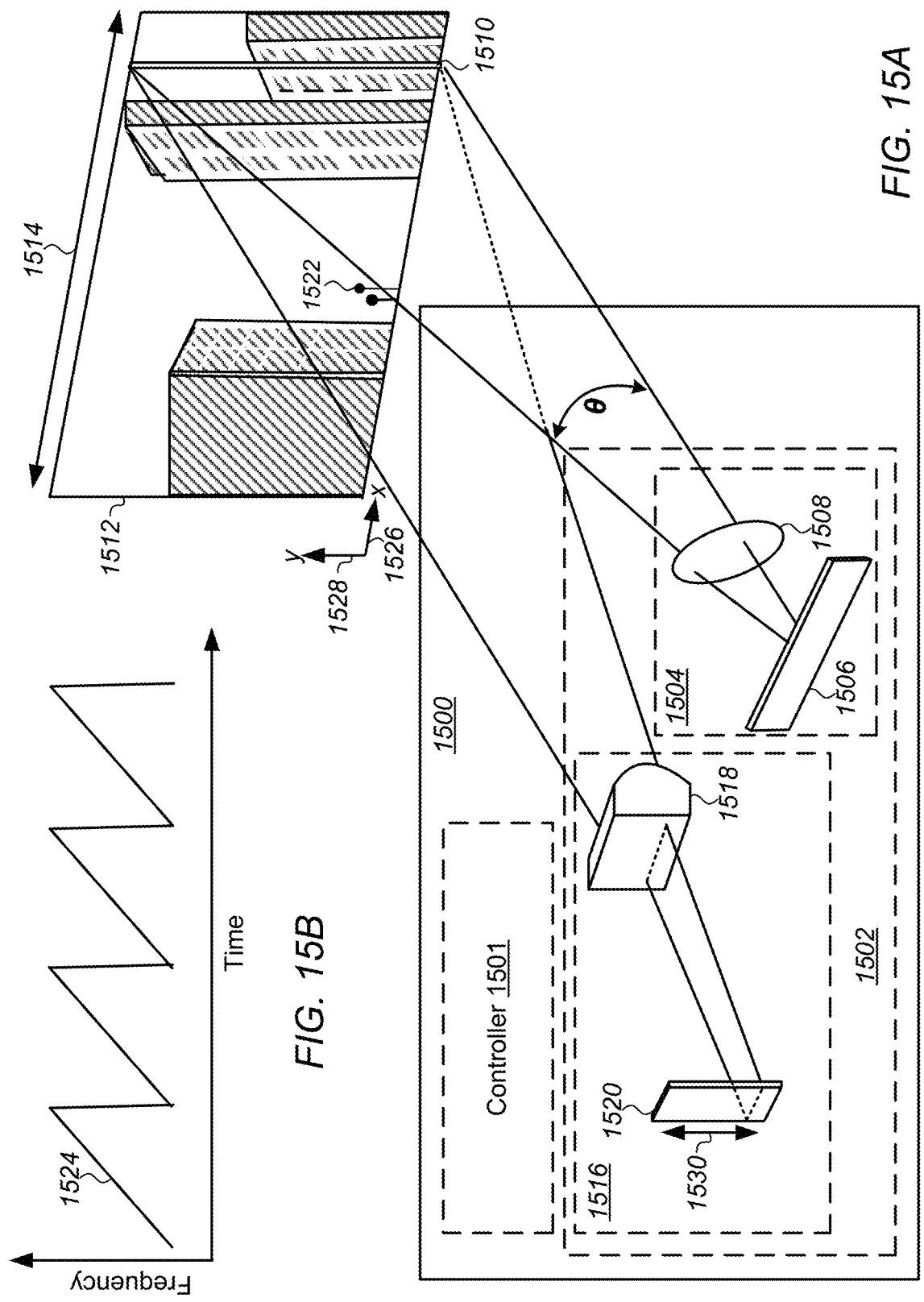

MEMS BASED SPATIAL LIGHT MODULATORS WITH IMPROVED THERMAL CONTROL

CROSS-REFERENCE TO RELATED APPLICATIONS

This application claims the benefit of priority under 35 U.S.C. 119(e) to U.S. Provisional Patent Application Ser. No. 63/146,488, filed Feb. 5, 2021, which is incorporated by reference herein in its entirety.

TECHNICAL FIELD

The present invention relates generally to spatial light modulators (SLMs), and more particularly to a microelectromechanical systems (MEMS) based SLM enclosed in a package filled with a fill gas having a low molar mass and high thermal conductivity to enhance the reliability and lifetime of the SLM.

BACKGROUND

Spatial light modulators or SLMs include an array of one or more diffractors or modulators that can control or modulate an incident beam of light in a spatial pattern that corresponds to an electrical input to the devices. The incident light beam, typically generated by a laser, can be modulated in intensity, phase, polarization or direction. Spatial light modulators are increasingly being developed for use in various applications, including display systems, optical information processing and data storage, printing, maskless lithography, 3D printing, additive manufacturing, surface modification and optical phase modulators.

One type of spatial light modulator (SLM) potentially useful in the aforementioned applications is a microelectromechanical systems (MEMS) based SLM including an array of dynamically adjustable reflective surfaces or mirrors mounted over a substrate. In operation electromagnetic radiation or light from a coherent light source, such as a laser, is projected onto the array, and alignment of the mirrors is altered by electronic signals generating electrostatic forces to displace at least some of the mirrors to modulate the phase, intensity and or angle of light reflected from the array.

Unfortunately, existing MEMS based SLMs cannot handle the high power lasers employed in laser processing systems for applications including cutting, marking, engraving, and 3D printing. Typically, the failure mode of these devices when exposed to high power or temperature lasers is the "Soret effect" in which atoms of a reflective metal, such as aluminum, covering reflective surfaces in the MEMS based SLM physically migrate along from a hotter to a cooler region of the ribbon. This migration of metal atoms can reduce the reflection and hence the efficiency of the SLM, and ultimately shortens useful device life.

Accordingly, there is a need for a MEMS based SLM with improved thermal and high-power handling capabilities.

SUMMARY

A microelectromechanical systems (MEMS) based spatial light modulator (SLM) enclosed in a package filled with a fill gas having a low molar mass and high thermal conductivity to enhance the reliability and lifetime of the SLM is described. The MEMS based SLM can include one or more of a grating light valve (GLV™), a planar light valve (PLV™) or a linear PLV (LPLV), all of which are commercially available from Silicon Light Machines Inc., of San Jose CA, and are described in detail hereinafter. All of these devices are capable of phase and/or amplitude modulation with spatial filtering.

Generally, the SLM includes a number of MEMS modulators, each including a number of light reflective surfaces, at least one light reflective surface coupled to an electrostatically deflectable element suspended above a substrate, and each adapted to reflect and modulate a light beam incident thereon. The package enclosing the SLM includes an optically transparent cover through which the reflective surfaces are exposed to the light beam, and a cavity is filled with a low molar mass fill gas having an atomic number of two or less and a thermal conductivity of greater than 100 milliwatts per meter kelvin (mW/(m·K).

In one embodiment, each of the MEMS based diffractors include a number of electrostatically deflectable ribbons suspended over a substrate, each ribbon having a light reflective surface. Electrostatic deflection of one or more of the ribbons brings light reflected from the light reflective surface of a first electrostatically deflectable ribbon into interference with light reflected from the light reflective surface of ribbons in the diffractors in same or adjacent diffractors to modulate light incident thereon.

In another embodiment, the MEMS based diffractors are two-dimensional diffractors, each including: a piston layer suspended over a surface of a substrate by posts at corners thereof, the piston layer including an electrostatically deflectable piston and a number of flexures through which the piston is coupled to the posts; a first reflective surface over a top surface of the piston; and a faceplate suspended over the piston layer, the faceplate including a second reflective surface on a top surface of the faceplate, and an aperture through which the piston is exposed. Electrostatic deflection of the piston brings light reflected from the first reflective surface into interference with light reflected from the second reflective surface to modulate light incident thereon.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the present invention will be understood more fully from the detailed description that follows and from the accompanying drawings and the appended claims provided below, where:

FIG. 10 is a flow chart illustrating an embodiment of a method for operating a MEMS-based SLM packaged in a MEMS package filled with a low molar mass and high thermal conductivity fill gas;

FIG. 15 is a schematic diagram of a Light Detection and Ranging (LiDAR) system including a SLM including a linear array of MEMS based modulators enclosed in a cavity filled with a low molar mass and high thermal conductivity fill gas.

DETAILED DESCRIPTION

The present disclosure is directed to microelectromechanical systems (MEMS) based spatial light modulators (SLMs) enclosed in a MEMS package filled with a fill gas having a low molar mass and high thermal conductivity to enhance the reliability and lifetime of the SLM, and methods for operating the same in various applications are described.

In the following description, numerous specific details are set forth, such as specific materials, dimensions and processes parameters etc. to provide a thorough understanding of the present invention. However, particular embodiments may be practiced without one or more of these specific details, or in combination with other known methods, materials, and apparatuses. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1A:
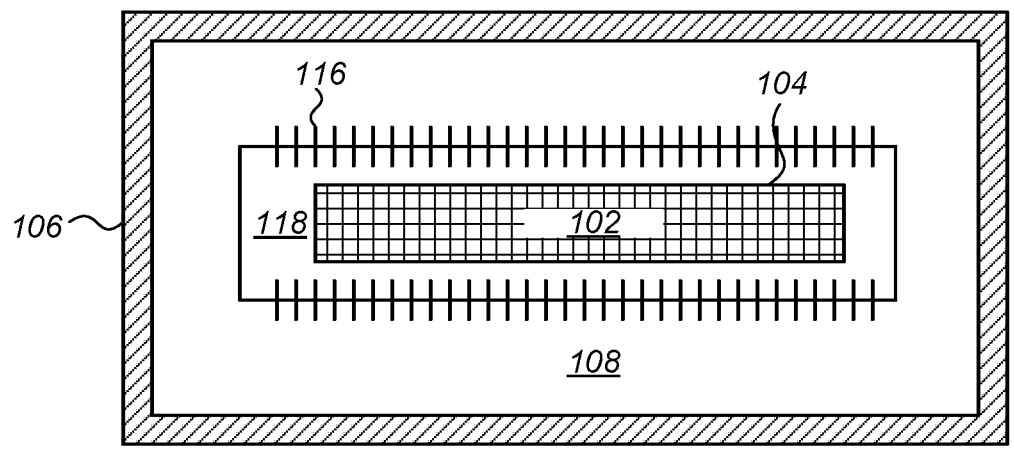
FIGS. 1A and 1B are schematic diagrams in a side and top view of an embodiment of a microelectromechanical systems (MEMS) based spatial light modulator (SLM) enclosed in a package filled with a fill gas having a low molar mass and high thermal conductivity.
Figure 1B:
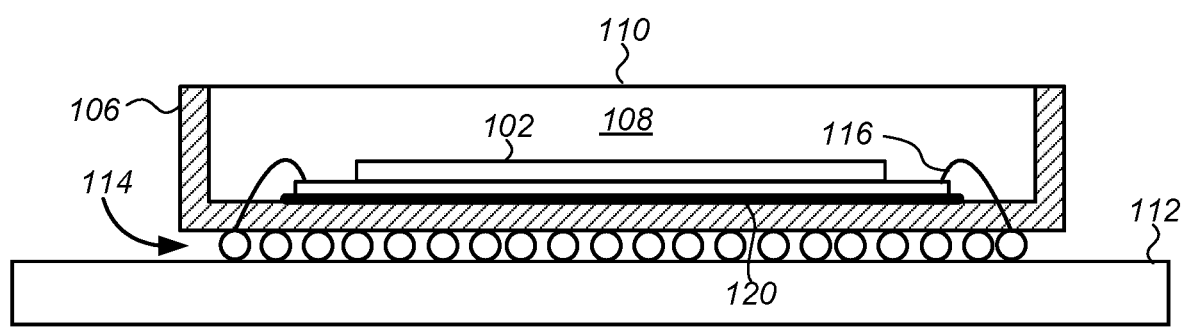

FIGS. 1A and 1B are schematic diagrams in a top and side view of an embodiment of a microelectromechanical system (MEMS) based spatial light modulator (SLM 100). Referring to FIG. 1A the SLM 100 generally includes a linear array 102 with a number of individual MEMS based light modulators 104 enclosed in a package 106 including a cavity 108 filled with a fill gas having a low molar mass and high thermal conductivity in which the linear array is enclosed, and an optically transparent cover 110 through which the number of modulators are exposed to a light beam. By low molar mass and high thermal conductivity it is meant an element having an atomic weight of two or less, i.e., helium (He) or hydrogen (H), and a thermal conductivity of greater than 100 milliwatts per meter kelvin (mW/(m·K). Generally, each modulator 104 includes a number of light reflective surfaces (not shown in these figures) including at least one light reflective surface coupled to an electrostatically deflectable element to bring light reflected therefrom into constructive or destructive interference with another light reflective surface in the modulator or an adjacent modulator to modulate the amplitude or phase of a coherent light beam incident on the SLM 100.

Referring to FIG. 1B, in the embodiment shown the package 106 is a surface-mount, no lead type of packaging, mechanically and electrically coupled to a circuit board 112 through a ball grid array (BGA 114) or pin grid array (PGA) (not shown). The package 106 includes the cavity 108 in which the linear array 102 is enclosed, the optically transparent cover 110 through which reflective surfaces the modulators 104 are exposed, and wire bonds 116 to electrically couple the MEMS-based SLM to the BGA 114. Generally, the linear array 102 is fabricated on a substrate 118 attached to the package 106 by a thin layer of solder 120.

In one embodiment, the cavity 108 is hermetically sealed and has a static pressure of at least 0.01 atmospheres. Preferably, the fill gas includes a gas mixture of from at least about 10 to about 100% hydrogen (H) or helium (He), at a static pressure of 0.1 atmospheres or greater, and more preferably, the fill gas has a pressure of about 1 bar or 1 atmosphere.

Figure 1C:
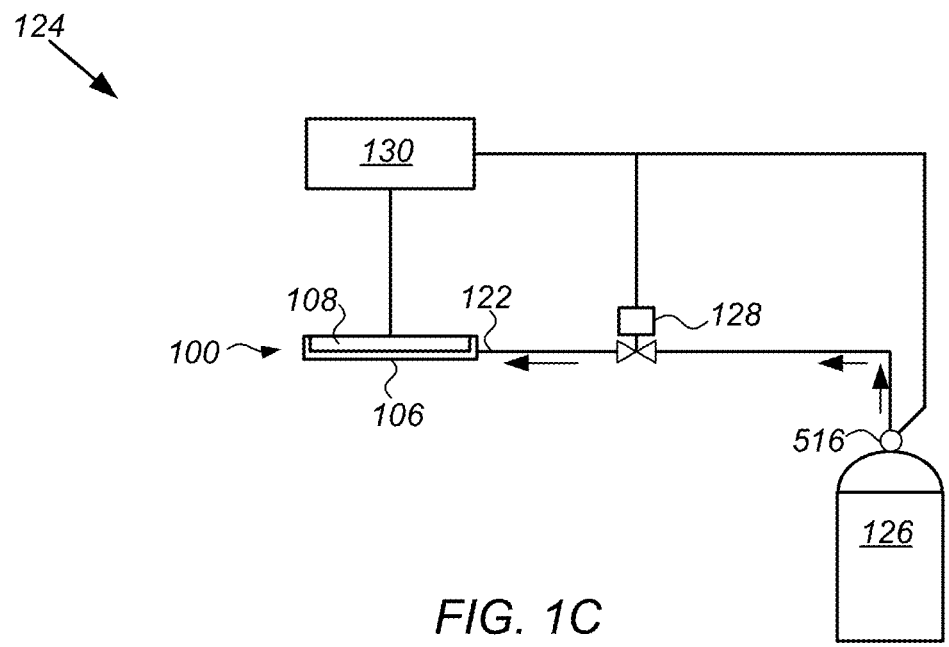
FIG. 1C is a schematic block diagram of another embodiment of a MEMS based SLM enclosed in a package, and further including a system to pressurize the package with a fill gas having a low molar mass and high thermal conductivity.

Optionally or alternatively in another embodiment shown in FIG. 1C the the MEMS package 106 further includes fill gas inlet or an inlet 122 by means of which the fill gas is introduced into the cavity 108 from a gas supply system 124, to dynamically maintain a desired pressure of the fill gas therein. Generally, the gas supply system 124 includes a fill gas source 126, such as a gas cylinder or Dewar storing a liquefied gas and a monitor, such as a mass flow controller (MFC 128) to control and/or monitor the flow of fill gas to an inlet 122 of the package 106, and a controller 130 to control operation of the MFC.

Figure 1D:
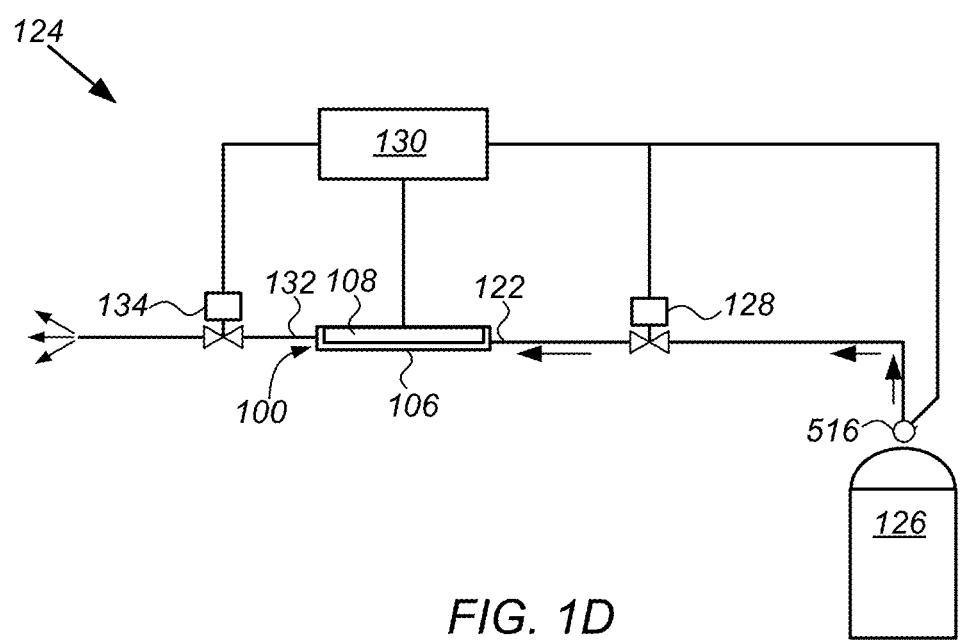
FIG. 1D is a schematic block diagram of another embodiment of a MEMS based SLM enclosed in a flow through package, and further including a system to flow a fill gas having a low molar mass and high thermal conductivity through the package.

In another embodiment shown in FIG. 1D the package 106 is a flow through package further including a fill gas outlet or an outlet 132 opposite the inlet 122, and the gas supply system 124 further includes a second MFC or solenoid valve 134, through which the fill gas is exhausted or removed and is operable to provide a flow of gas from 0.01 standard cubic centimeters per minute (sccm) to 10000 sccm during operation of the SLM 100.

Generally, it has been found that the thermal conductivity and cooling of the MEMS based SLM is dependent, inter alia, on a thermal conductivity of the fill gas used. Table I below shows the thermal conductivity of various potential fill gases at 300 K.

TABLE I

| Gas | Thermal conductivity at 300 K (W/mK) |
|---|---|
| Air | 0.026 |
| Ar | 0.018 |
| CO | 0.025 |
| $CO_2$ | 0.017 |
| H | 0.182 |
| He | 0.151 |
| $N_2$ | 0.026 |
| Ne | 0.049 |
| $O_2$ | 0.027 |

It is seen from table I that the thermal conductivity of Helium (He) is about 6 times that of $N_2$. Thus, a thermal FEA (finite element analysis) predicts a 3.5 times improvement in cooling, and therefore power handling capability for the MEMS based SLM enclosed in a package including a cavity filled with helium (He) as compared to a cavity filled with air or nitrogen ($N_2$). Furthermore, results of tests on a single 2D modulator of a MEMS based SLM, described in detail below, confirm that a surface of the modulators is illuminated by a 4 $kW/cm^2$ photon flux and enclosed in a cavity filled with a nitrogen fill gas has temperature of ~148° C. on a surface of the mirror, in contrast to a temperature of just 43° C. when a Helium fill gas is used.

An embodiment of a MEMS-based SLM including a multi-pixel, linear array of ribbon-type, electrostatically adjustable modulators, such as a GLV™, for which the package and method of the present disclosure is particularly useful will now be described with reference to FIGS. 2A through 2C. For purposes of clarity, many of the details of SLMs in general and MEMS-based ribbon-type modulators in particular that are not relevant to the present invention have been omitted from the following description. The drawings described are only schematic and are non-limiting. In the drawings, the size of some of the elements may be exaggerated and not drawn to scale for illustrative purposes. The dimensions and the relative dimensions may not correspond to actual reductions to practice of the invention.

Figure 2A:
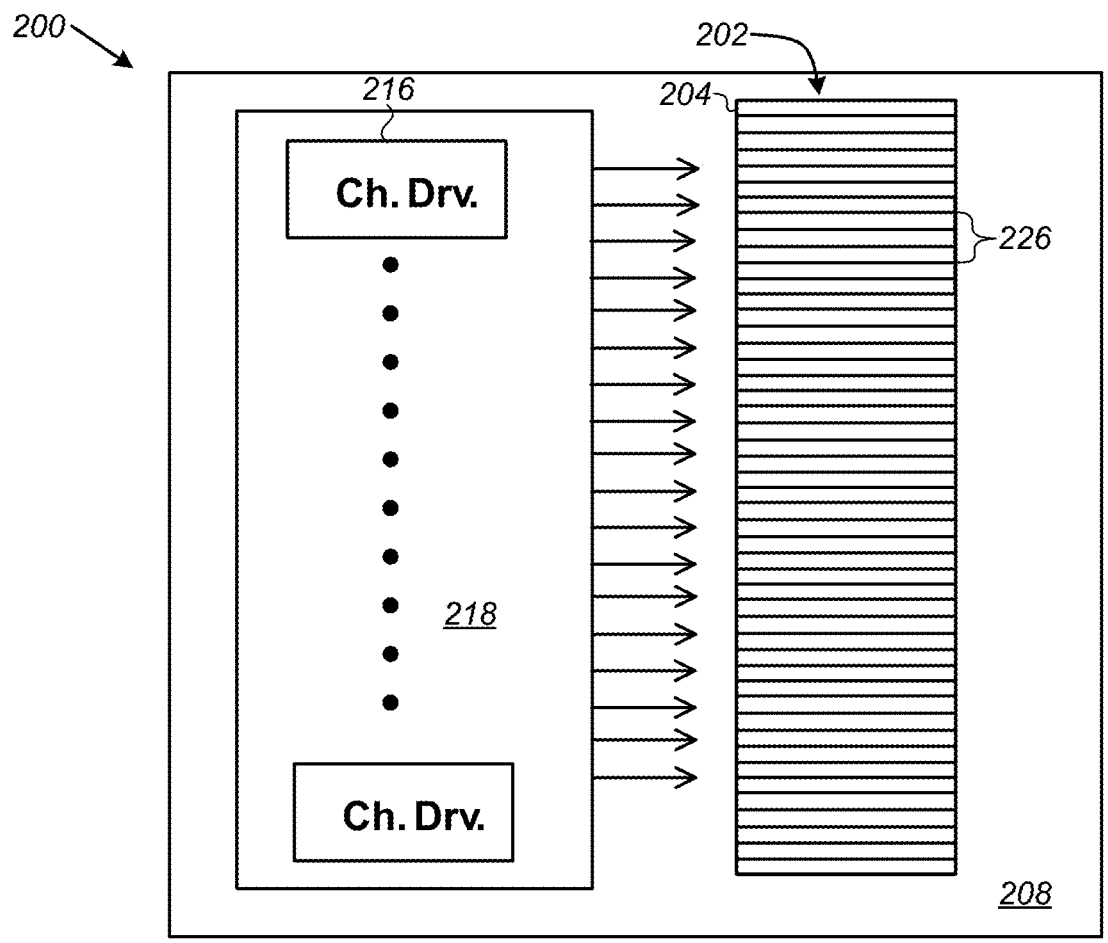
FIGS. 2A-2C are schematic block diagrams illustrating an embodiment of a MEMS based SLM including ribbon-type Microelectromechanical System modulators.
Figure 2B:
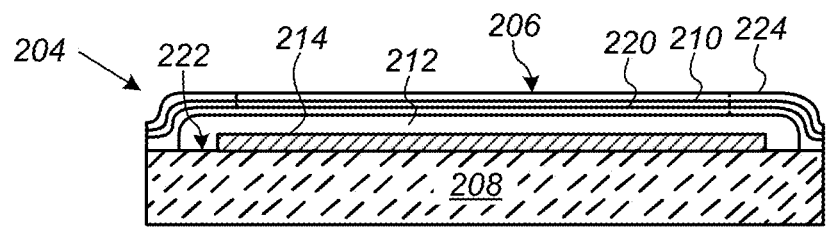

Referring to FIGS. 2A and 2B in the embodiment shown the SLM 200 includes a linear array 202 composed of thousands of free-standing, addressable electrostatically actuated ribbons 204, each ribbon having a light reflective surface 206 supported over a surface of a substrate 208, where a number of ribbons are grouped together to form the MEMS-based modulators. Each of the ribbons 204 includes an electrode 210 and is deflectable through a gap or cavity 212 toward the substrate 208 by electrostatic forces generated when a voltage is applied between the electrode 210 in the ribbon 204 and a base electrode 214 formed in or on the substrate. Each of the ribbon electrodes 210 are driven by one of a number of drive channels 216 in a driver 218, which may be integrally formed on the same substrate 208 with the linear array 202, as in the embodiment shown, or formed on a second substrate or chip and electrically coupled thereto (not shown).

A schematic sectional side view of a ribbon 204 of the SLM 200 of FIG. 2A is shown in FIG. 2B. Referring to FIG. 1B, the ribbon 204 includes an elastic mechanical layer 220 to support the ribbon above a surface 222 of the substrate 208, a conducting layer or electrode 210 and a reflective layer 224 including the reflective surface 206 overlying the mechanical layer and conducting layer.

Generally, the mechanical layer 220 comprises a taut silicon-nitride film, and is flexibly supported above the surface 222 of the substrate 208 by a number of posts or structures, typically also made of silicon-nitride, at both ends of the ribbon 204. The conducting layer or electrode 210 can be formed over and in direct physical contact with the mechanical layer 220, as shown, or underneath the mechanical layer. The conducting layer or ribbon electrode 210 can include any suitable conducting or semiconducting material compatible with standard MEMS fabrication technologies. For example, the conducting layer forming the electrode 210 can include a doped polycrystalline silicon (poly) layer, or a metal layer. Alternatively, if the reflective layer 224 is metallic it may also serve as the electrode 210.

The separate, discrete reflecting layer 224, where included, can include any suitable metallic, dielectric or semiconducting material compatible with standard MEMS fabrication technologies, and capable of being patterned using standard lithographic techniques to form the reflective surface 206.

In the embodiment shown, a number of ribbons are grouped together to form a large number of MEMS channels or pixels 226, each driven by a much smaller number of drive channels 216. Deflection of a ribbon 204 causes light reflected from the reflective surface 206 to constructively or destructively interfere with light reflected from the reflective surface of an adjacent ribbon, there enabling the pixel 226 to switch between an on or bright state, an off or dark state or an intermediate gray-scale.

Figure 2C:
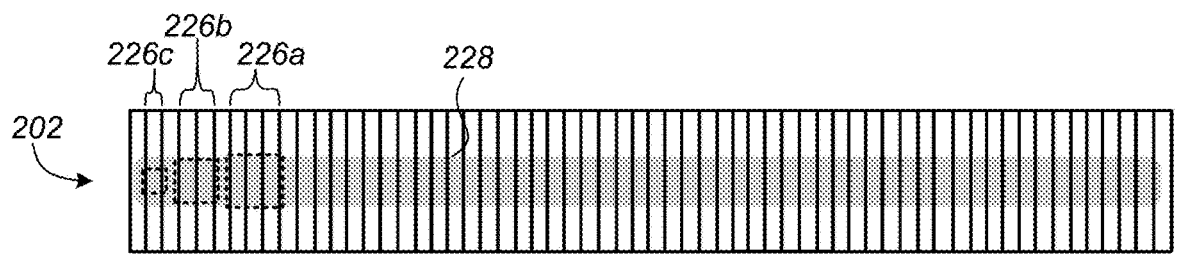

Referring to FIG. 2C in one embodiment the linear array 202 includes 1088 individually addressable ribbons 204 that can be grouped together to form channels or pixels 226 having any number of ribbons depending on pixel size requirements. Additionally, the SLM can include drive channels 216 (shown in FIG. 2A) with up to 10-bit amplitude modulation to support gray-scale, and is capable of being modulated or switched at speeds up to 350 kHz. Referring again to FIG. 2C, shaded rectangle illustrates an illuminated area 228 on the linear array 202 illuminated by a rectangular beam directed onto the linear array 202 of the SLM 200. In some embodiments for the SLM 200, it is desirable to provide pixel configurations having a square aspect ratio. For example, in the embodiment shown wherein the linear array 202 includes thousands of ribbons 204, each having a width of about 25 µm, and the illuminated area 228 has a width of about 75 µm, the ribbons can be grouped to form 360 square pixels 226a each including portions of three adjacent ribbons. Alternatively, the width of the illuminated area can be reduced to about 50 µm and the ribbons 204 can be grouped to form 512 50 µm×50 µm square pixels 226b each including portions of two adjacent ribbons, or the width of the illuminated area can be further reduced to about 25 µm such that each ribbon forms 1088 25 µm×25 µm square pixels 226c.

Another type of SLM including a multi-pixel, linear array of MEMS-based two-dimensional (2D) modulators, such as a Linear Planar Light Valve (LPLV™) commercially available from Silicon Light Machines, Inc., of San Jose, California, for which the package and method of the present disclosure is particularly advantageous will now be described with reference to FIGS. 3A through 3C and FIG. 4.

For purposes of clarity, many of the details of fabricating and operating MEMS-based two-dimensional (2D) modulators, which are widely known and not relevant to the present invention, have been omitted from the following description. MEMS-based 2D modulators are described in greater detail, for example, in commonly assigned U.S. Pat. No. 7,064,883, entitled, "Two-Dimensional Spatial Light Modulator," by Alexander Payne et al., issued on Jun. 20, 2006, and incorporated herein by reference in its entirety.

Figure 3A:
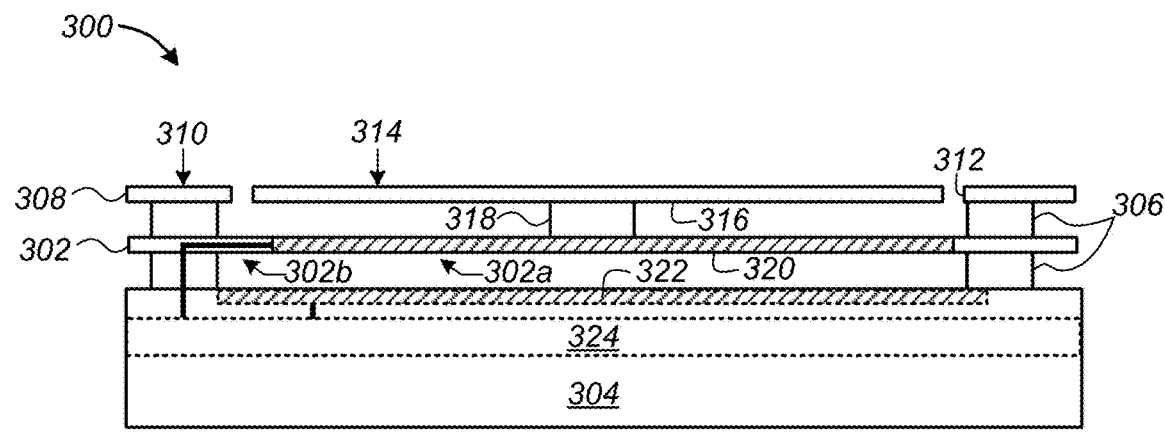
FIGS. 3A-3C are schematic block diagrams illustrating an embodiment of a MEMS based SLM including two-dimensional (2D) modulators.

FIG. 3A illustrates a schematic block diagram of a sectional side view of a 2D diffractor or modulator 300 in a quiescent or un-driven state. Referring to FIG. 3A, the 2D modulator 300 generally includes a piston layer 302 suspended over a surface of a substrate 304 by posts 306 at corners of the piston layer and/or 2D modulator. The piston layer 302 includes an electrostatically deflectable piston 302a and a number of flexures 302b through which the piston is flexibly or movably coupled to the posts 306. A faceplate 308 overlying the piston layer 302 includes a first light reflective surface 310 and an aperture or cut-out portion 312 which separates the faceplate from a second reflective surface 314 on or attached to the piston 302a. The second light reflective surface 314 can either be formed directly on the top surface of the piston 302a, or, as in the embodiment shown, on a mirror 316 supported above and separated from the piston 302a by a central post 318 extending from the piston to the mirror. The first and second light reflective surfaces 310, 314, have equal area and reflectivity so that in operation electrostatic deflection of the piston 302a caused by an electrode 320 formed in or on the piston layer 302 and an electrode 322 in the substrate 304 brings light reflected from the first light reflective surface 310 into constructive or destructive interference with light reflected from the second light reflective surface 314.

Generally, the electrode 322 in the substrate 304 is coupled to one of a number drive channels in a drive circuit or driver 324, which can be integrally formed in the substrate adjacent to or underlying the 2D modulator 300, as in the embodiment shown. The electrode 322 in the substrate 304 can be coupled to the driver 324 through a via extending through the substrate from the driver to the electrode, and the electrode 320 formed in or on the piston layer 302 can be coupled to the driver or an electrical ground through a conductor extending through one of the posts 306 and the piston layer. As explained in greater detail below, typically multiple individual 2D modulators 300 are grouped or ganged together under control of a single drive channel to function as a single pixel in the multi-pixel, linear array of the SLM.

Figure 3B:
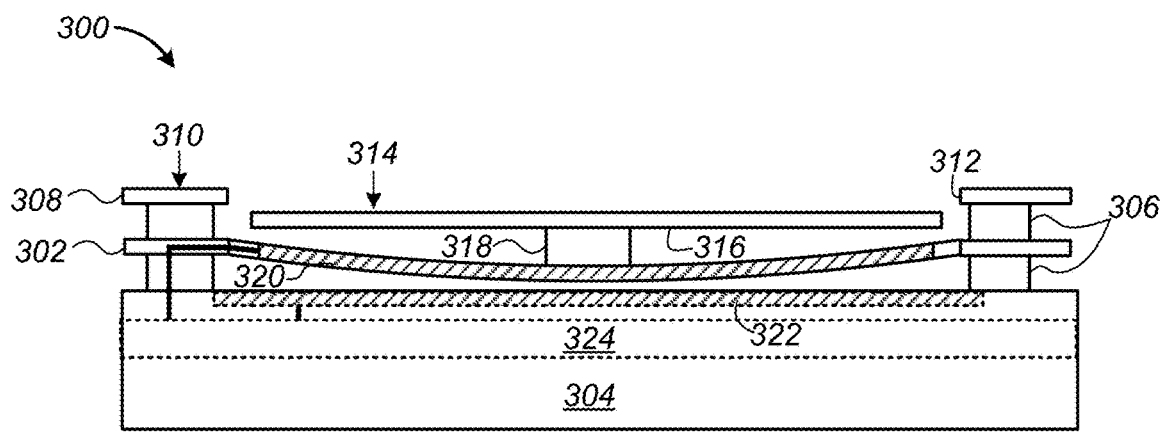
Figure 3C:
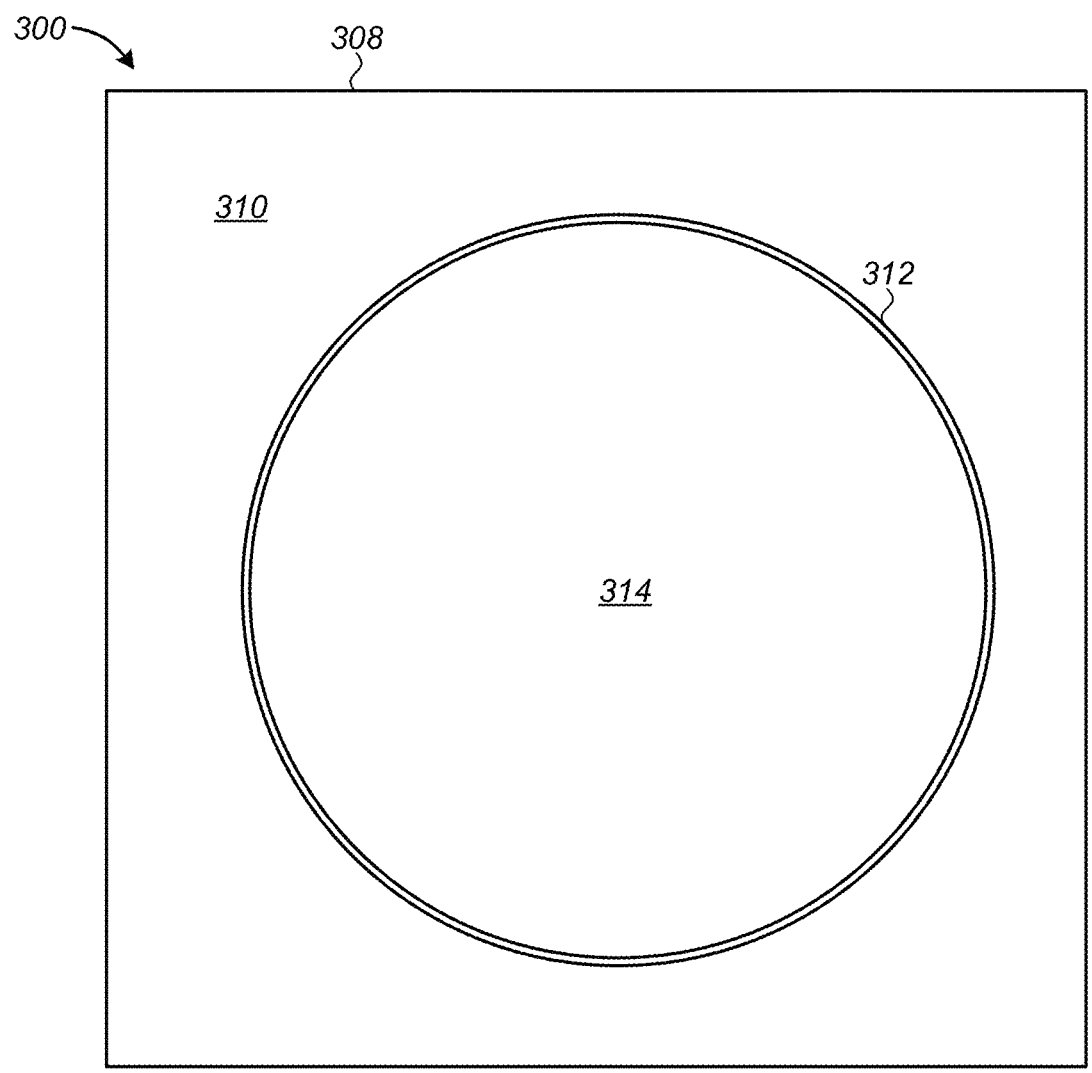

FIG. 3B is a schematic block diagram of the 2D modulator 300 of FIG. 3A in an active or driven state, showing the piston 302a deflected towards the substrate 304, and FIG. 3C is a top view of the 2D modulator of FIGS. 3A and 3B illustrating the static, first light reflective surface 310 and the movable second light reflective surface 314.

Figure 4:
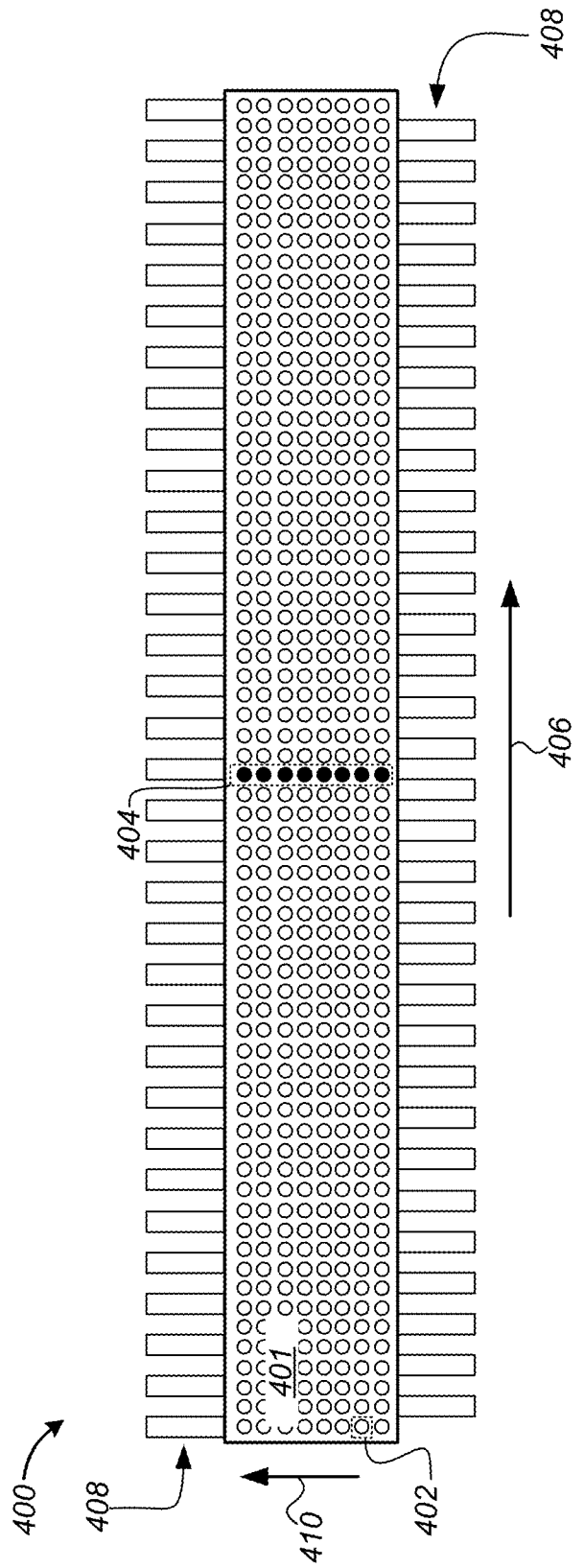
FIG. 4 is a schematic block diagram of a top view of a SLM including a multi-pixel, linear array of MEMS based 2D diffractors, such as those shown in FIGS. 3A-3C.

An exemplary multi-pixel, linear array of dense-packed, MEMS-based 2D modulators will now be described with reference to the block diagram of FIG. 4. FIG. 4 is a planar top view of a SLM 400 including a linear array 401 of 2D modulators 402, such as those shown in FIGS. 3A-C, grouped or coupled together to a number of drive channels to or pixels.

Referring to FIG. 4, in one embodiment the 2D modulators 402 are grouped into a linear array 401 of interleaved channels or pixels 404 along a first, horizontal or longitudinal axis 406. Each of the 2D modulators 402 in a single pixel 404 share a common drive channel or driver 408. Although in the embodiment shown each pixel 404 is depicted as having a single column of 12 modulators 402 grouped along a transverse or vertical or transverse axis 410 perpendicular to the horizontal or longitudinal axis 406 of the array, this is merely to facilitate illustration of the array. It will be appreciated that each channel or pixel can include any number of 2D modulators arranged in one or more columns of any length across the width or vertical or transverse axis of the array without departing from the spirit and scope of the invention. For example, in one embodiment of the SLM 400 particularly suited for the spectral shaping systems and methods of the present disclosure, each pixel 404 includes a single column of 40 modulators grouped along the transverse axis 410 of the array. Similarly, the SLM 400 can include a linear array 401 having any number of pixels 404 or a number of individual linear arrays placed end to end adjacent to one another. This later configuration can help to increase power handling of the SLM 400 as the optically active area of the linear array 401 gets larger by increasing the number of columns of modulators per pixel. If the damage threshold per modulator is constant, power handling can be increased proportional to the area increase.

In order to maximize or provide sufficient contrast for the SLM 400 it is desirable that incident light from an illumination source, have a numerical aperture (NA) or cone angle (Θ) which is smaller than the first-order diffraction angle (θ) of the diffractive SLM 400. The diffraction angle (θ) of the SLM is defined as the angle between light reflected from a pixel 404 in the $0^{th}$ order mode or state, and light reflected from the same pixel in the plus and/or minus $1^{st}$ order mode. However, according to the grating equation, diffraction angles of a periodic surface, such as the linear array 401 of the SLM 400, are set by a ratio of wavelength of light incident on the array to a spatial period or pitch of features of the periodic surface, i.e., the pixels 404. In particular, the grating equation, equation 1 below, states:

$$\sin \theta = m\lambda/\Lambda \qquad (1)$$

where θ is a diffraction angle of light reflected from the surface, m is order of diffracted ray (integer), λ is the wavelength of the incident light, and Λ is a spatial or pitch of the modulator 402. When we focus on a single pixel which has multiple modulators 402 and the incident light is ideal plane wave or has a numeric aperture (NA)=0, the light spreads due to Huygen-Fresnel principle. The spreading angle Θ is defined by equation 2 below as:

$$\Theta = \lambda/D \quad (2)$$

where D is a pixel size.

Achieving adequate contrast with conventional grating based SLMs requires either limiting illumination NA by means of an aperture (and suffering the associated throughput loss), or providing a large diffraction angle by reducing the size and spatial period or pitch of the individual modulators. However, this latter approach is problematic for a number of reasons including the need for larger, higher voltage drive circuits to drive smaller, movable grating elements, and a reduction of an optical power handling capability of the SLM resulting from such smaller grating elements.

In contrast to conventional grating based SLMs, a SLM 400 including MEMS-based 2D modulators 402, such as the LPLV™ is configured to have multiple pixels 404 each pixel including several modulators 402 arranged along the transverse or vertical axis 410 of the array (twelve in the embodiment shown), but with a much smaller number, generally only one or two modulators, arranged along the horizontal or longitudinal axis 406. Because of this, the spreading angle $\Theta_H$ of diffracted light from the pixel 404 along the longitudinal axis, where the pixel size is much smaller than along the vertical or transverse or transverse axis, is much larger than the spreading angle $\Theta_V$ of the pixel along the transverse axis. Conversely, the numerical aperture of illumination in the vertical direction (array short axis) can be much larger than the numerical aperture in the horizontal direction (array long axis) since the latter is limited by the diffraction angle of the SLM in order to achieve sufficient contrast. Thus by using a linear array of 2D modulators in combination with an asymmetric illumination NA in the longitudinal and transverse directions, the overall throughput of the spectral shaper can be improved.

Figure 5A:
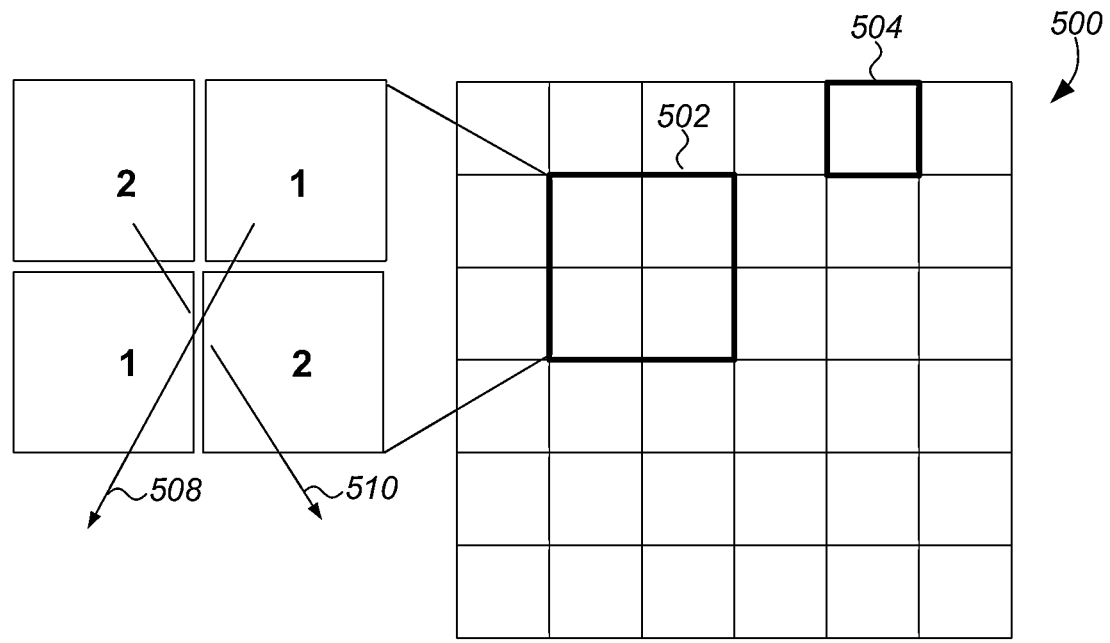
FIGS. 5A-5C illustrate schematic diagrams of a 2D MEMS based complex SLM suitable for use with a phase-modulated system.
Figure 5B:
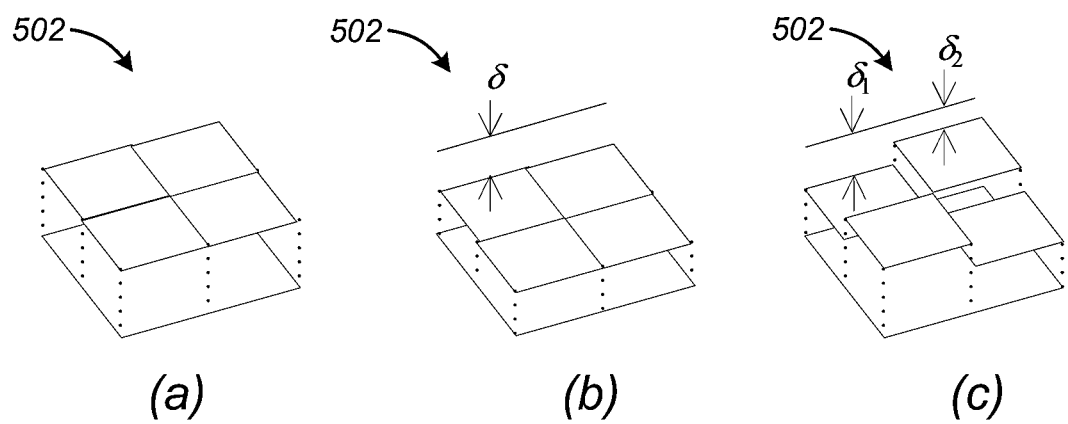
Figure 5C:
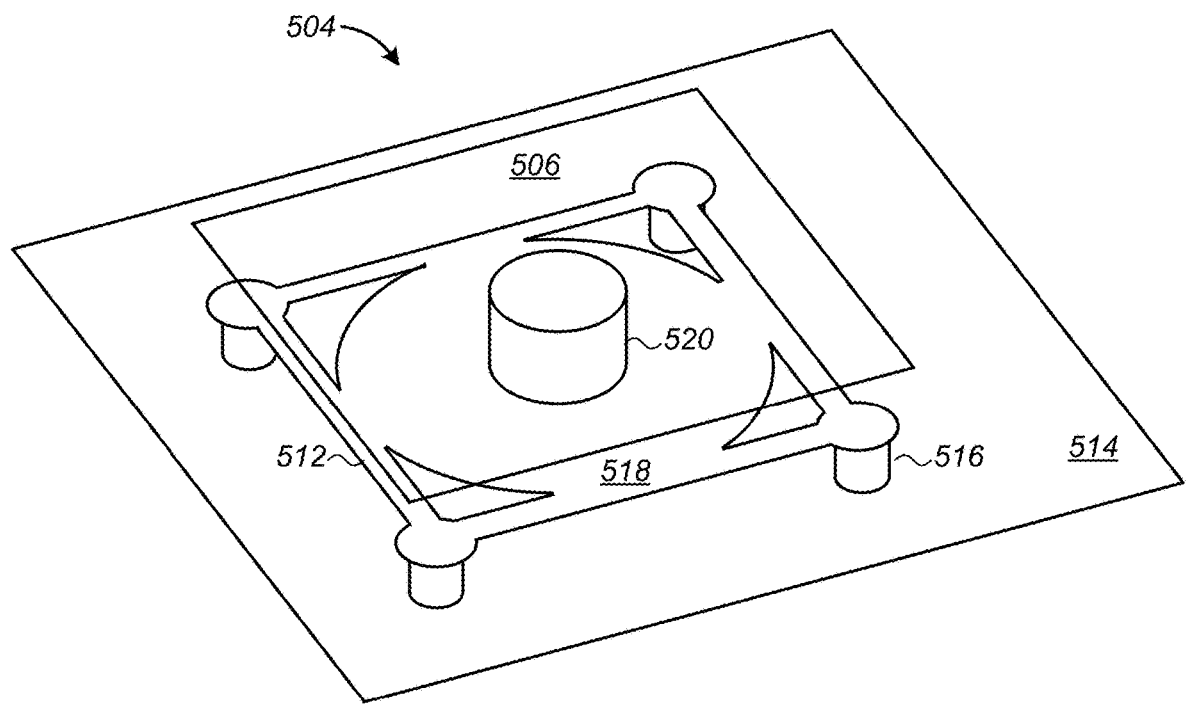

FIGS. 5A-5C illustrate schematic diagrams of a 2D MEMS based complex SLM for phase-modulation, for which the package and method of the present disclosure is particularly useful. Briefly, the complex SLM 500 includes multiple pixels 502, each pixel including multiple phase shift modulators 504. The phase shift modulators 504 each include an electrostatically displaceable mirror or reflective surface 506. The phase shift modulators 504 are configured such that substantially all light reflected from the complex SLM 500 comes from the phase shift modulators. Preferably, phase shift modulators 504 along diagonal lines 508, 510, are coupled to deflect in unison, by electrically interconnecting drive electrodes (not shown) below each phase shift modulator and applying a common drive voltage. In this way, each pixel 502 receives two independent driving voltages to deflect diagonally opposed phase shift modulators 504 as a group, denoted as group 1 and group 2 in FIG. 5A. The two groups, of each pixel 502 can be controlled independently of the other pixels to allow coherent light reflected from one pixel to constructively or destructively interfere with light reflected from one or more adjacent pixels, thereby modulating the light incident thereon. More preferably, the phase shift modulators 504 are deflectable through one or more wavelengths of light to enable both the phase and the amplitude of the reflected light to be modulated independently. FIG. 5B illustrates perspective views of a pixel 502 of the complex SLM 500 of FIG. 5A in (a) quiescent, (b) phase-modulated and (c) amplitude and phase modulated mode, where δ is equal to a quarter wavelength of the light incident on the complex SLM.

An exemplary embodiment of a phase shift modulator 504 of a complex SLM 500 will now be described in detail with reference to FIG. 5C. FIG. 5C depicts a detailed perspective view of a single phase shift modulator 504 in the complex SLM 500. Referring to FIG. 5C, the phase shift modulator 504 generally includes a film or membrane 512 disposed above an upper surface of a substrate 514 by a number of posts 516 with a displaceable or movable actuator or piston 518 formed therein. Supported above and affixed to each piston 518 by a support structure 520 is the reflective surface 506 that is positioned generally parallel to the surface of the substrate 514 and oriented to reflect light incident on a top surface of the complex SLM 500. The piston 518 and the associated reflective surface 506 form an individual phase shift modulator 504.

Individual pistons 518 or groups of pistons are moved up or down over a very small distance (typically only a fraction of the wavelength of light) relative to the substrate 514 by electrostatic forces controlled by drive electrodes (not shown) in the substrate underlying the actuator membrane 512. Preferably, the pistons 518 can be displaced by n*λ/2 wavelength, where λ is a particular wavelength of light incident on the complex SLM 500, and n is an integer equal to or greater than 1. Moving the piston 518 brings reflected light from the planar light reflective surface 506 of one phase shift modulator 504 into constructive or destructive interference with light reflected by adjoining phase shift modulators in a pixel, thereby modulating light incident on the complex SLM 500.

Figure 6A:
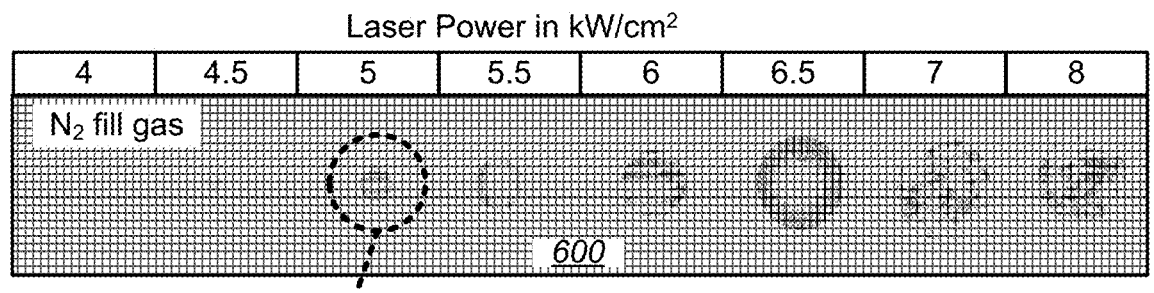
FIGS. 6A and 6B show top views of portions of SLMs including a linear array of MEMS based modulators illustrating damage to the SLMs enclosed in cavities filled with a low molar mass and high thermal conductivity fill gas caused by increasing laser power, as compared to SLMs enclosed in nitrogen filled cavities.
Figure 6B:
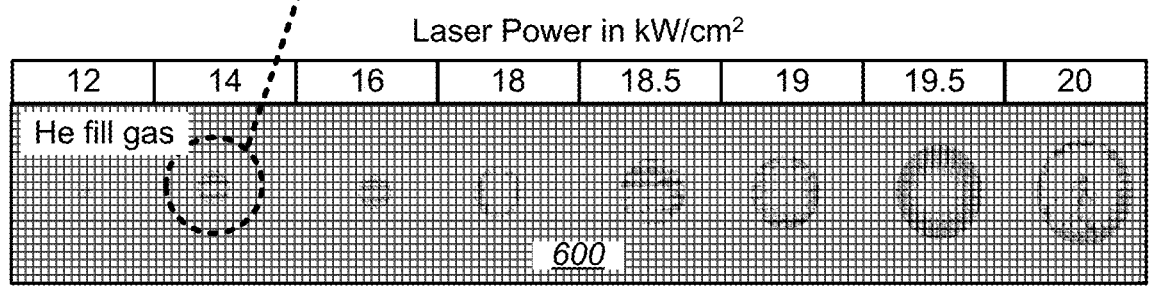

FIGS. 6A and 6B show top views of portions of a SLM including a linear array of MEMS based modulators, such as shown in FIG. 4, illustrating the effect of exposure to increasing laser power when enclosed in a cavity filled with nitrogen as compared to SLMs enclosed in cavities filled with a low molar mass and high thermal conductivity fill gas. Data for these illustrations were obtained using a 1064 nm laser with illumination optics operable to illuminate a 400 μm beam area of the linear array for a 5 second exposure at each of the different power levels. FIG. 6A illustrates results of exposure at increasing laser power levels from 4 to 8 kW/cm2 on a linear array 600 enclosed in cavity filled with a nitrogen ($N_2$) fill gas, at a pressure of about 31 pounds per square in gauge (psig). FIG. 6B illustrates results of exposure at increasing laser power levels from 12 to 20 kW/cm2 on a linear array 600 enclosed in cavity filled with a helium (He) fill gas, also at a pressure of about 31 psig. Referring to FIGS. 6A and 6B it is seen that these exposure tests (repeated twice for each fill gas) show a 2.5 to 3 times improvement in power handling capability for a linear array 600 enclosed in a He filled cavity over one filled with $N_2$. That is the power in kW/cm² that can be applied before damage to the SLM is about 2.5 to 3 times greater. In particular it is noted that the linear array 600 enclosed in the He filled cavity was exposed to a laser power of about 14 kW/cm² before damage was incurred similar to that seen for the linear array 600 enclosed in a nitrogen ($N_2$) filled cavity and exposed to a laser power of about 5 kW/cm².

Figure 7:
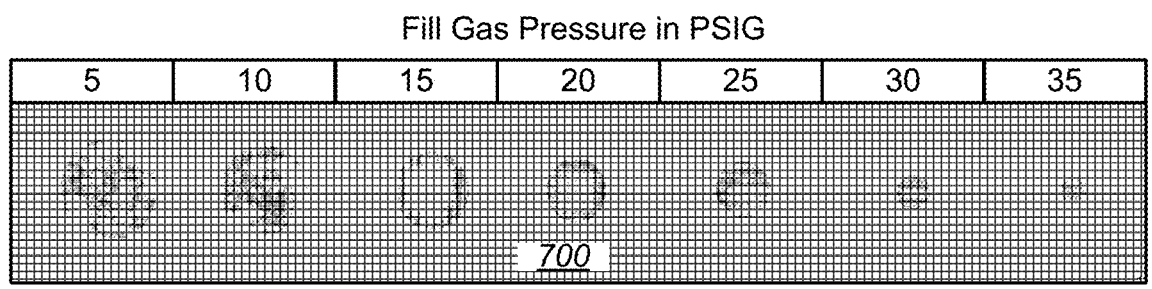
FIG. 7 shows top views of portions of SLMs including a linear array of MEMS based modulators enclosed in cavities filled with a low molar mass and high thermal conductivity fill gas illustrating the effect of fill gas pressure on damage caused by a laser operating at 14 kW/cm$^2$ power.

FIG. 7 shows top views of portions of a SLM including a linear array 700 of MEMS based modulators illustrating the ability of different pressures of a low molar mass and high thermal conductivity fill gas increase thermal conduction, thereby decreasing damage to the SLM, and increasing power handling capability while increasing reliability and longevity of the SLM. Data for these illustrations were obtained using a 1064 nm laser with a beam area of 400 μm operating at a power of about 14 kW/cm² for a 5 second exposure at each of the different pressures from 5 to 35 psig. Referring to FIG. 7 it is seen that a strong dependence was found, with damage reduced with increasing pressure, and the damage greatly between 10 and 15 psig, at atmospheric pressure of about 1 atmosphere or 14 psig.

Figure 8:
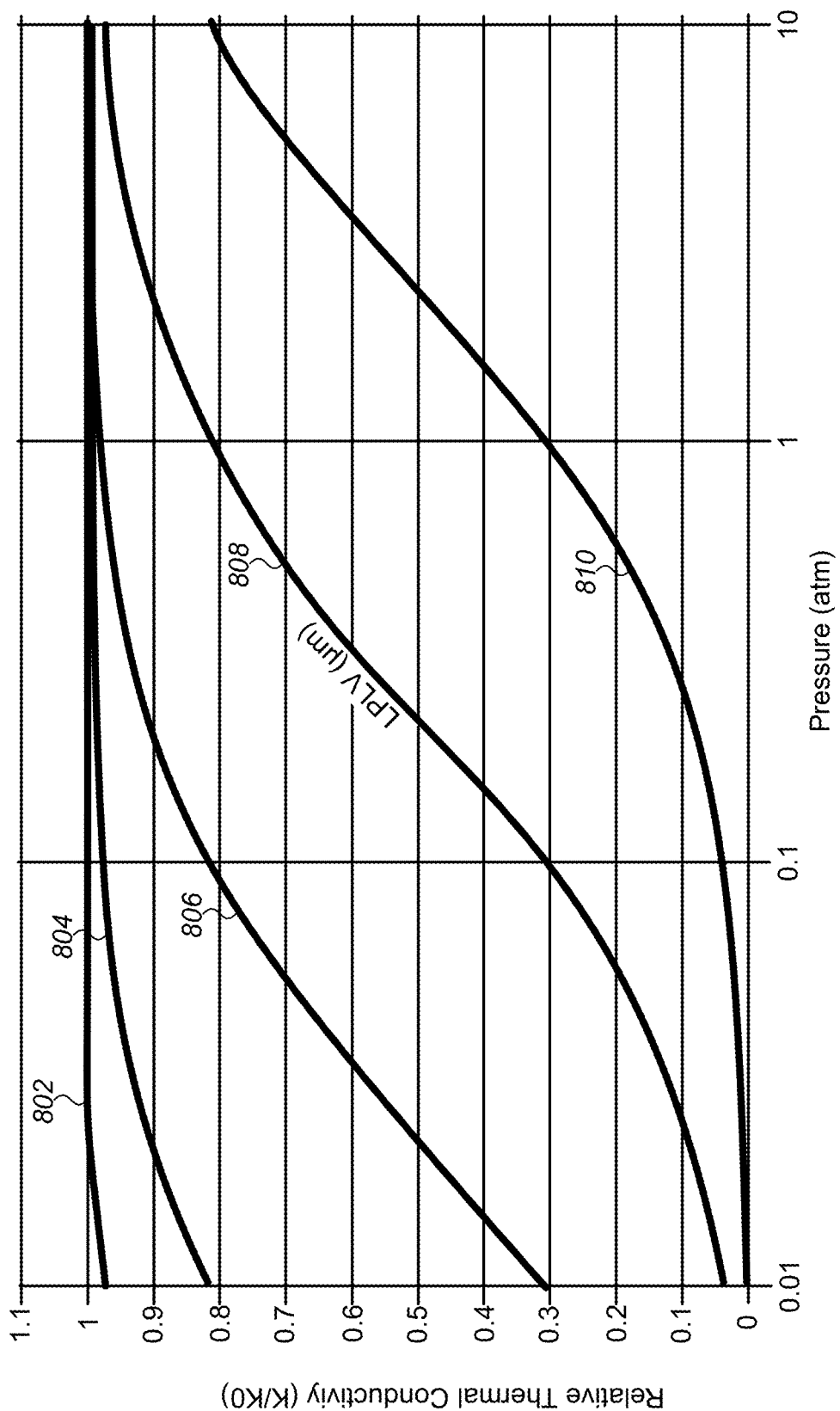
FIG. 8 is a graph illustrating relative thermal conductivity of a helium fill gas from 0.01 to 10 atmospheres for a MEMS-based modulators having different deflection gaps between the electrostatically deflectable element and a surface of a substrate.

FIG. 8 is a graph illustrating relative thermal conductivity of a helium fill gas from 0.01 to 10 atmospheres for MEMS-based SLM having different deflection gaps between the electrostatically deflectable element and a surface of a substrate. FIG. 8 was derived by calculating the rarified gas thermal conductivity equation 3 below, where the terms of the equation are given in Table II.

$$\frac{K}{K_c} = \frac{1}{1 + C\frac{T}{pd}} \quad (3)$$

TABLE II

| | | |
|---|---|---|
| C | (mK/N) | constant equal to 7.65E-5 |
| T | (K) | absolute temperature in Kelvin |
| p | (Pa) | Pressure in bar or atmospheres |
| d | (m) | deflection gap |
| K | (W/mK) | thermal conductivity |
| $K_0$ | (W/mK) | thermal conductivity at 1 bar |
| $K/K_0$ | — | thermal conductivity ratio |

Referring to FIG. 8 it is noted that as dimensions of the MEMS-based SLM, i.e., the deflection gap, are reduced thermal conductivity becomes a function of a pressure of the fill gas. By rarified it is meant a pressure less than 1 bar or atmosphere. In FIG. 8 line 802 represents the thermal conductivity of a helium fill gas from 0.01 to 10 atmospheres for a MEMS-based SLM a 1 mm deflection gap; line 804 represents the thermal conductivity for He fill gas with a MEMS-based SLM having a 100 μm deflection gap; line 806 represents the thermal conductivity for He fill gas with a MEMS-based SLM having a 10 μm deflection gap; line 808 represents the thermal conductivity for He fill gas with a MEMS-based SLM having a 1 μm deflection gap; and line 810 represents the thermal conductivity for He fill gas with a MEMS-based SLM having a 100 nm deflection gap. Referring to FIG. 8 it is seen that at reduced dimensions of a deflection gap between an electrostatic movable element, such as piston layer 302 and a surface of a substrate 304, thermal conductivity varies primarily as a function of fill gas pressure. It is further noted that for a MEMS based SLM, such as a linear PLV™ or LPLV described above, the results of the tests shown graphically that at pressures below 1 atmosphere the fill gas behaves as a rarified gas in which thermal conductivity drops and becomes a function of pressure. By rarified it is meant a pressure less than 1 bar or atmosphere.

Figure 9A:
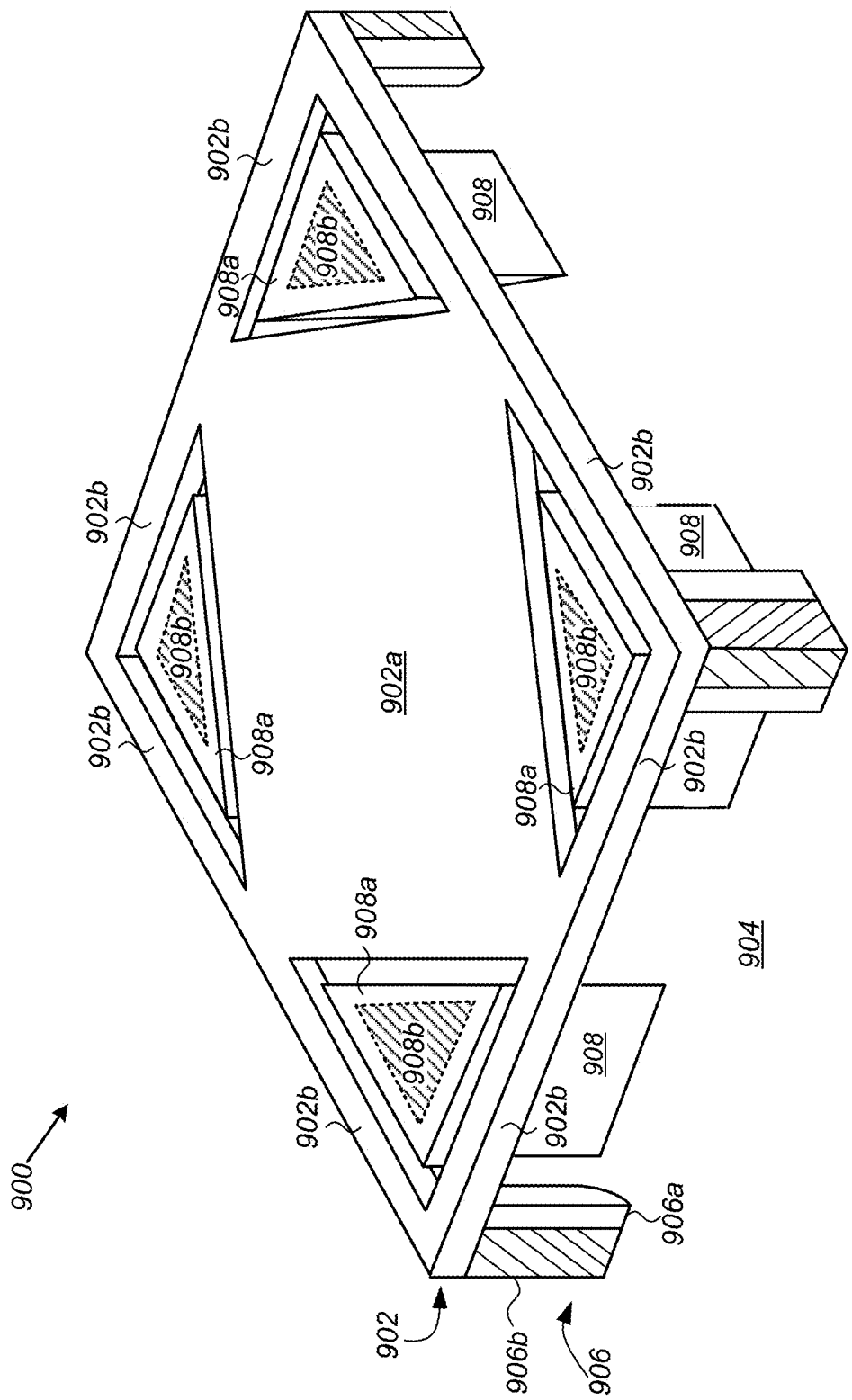
FIGS. 9A-9C are perspective views of a single 2D modulator or PLV™ for a MEMS based SLM including large, thermal sinking structures filling previously void areas according to an embodiment of the present disclosure.
Figure 9B:
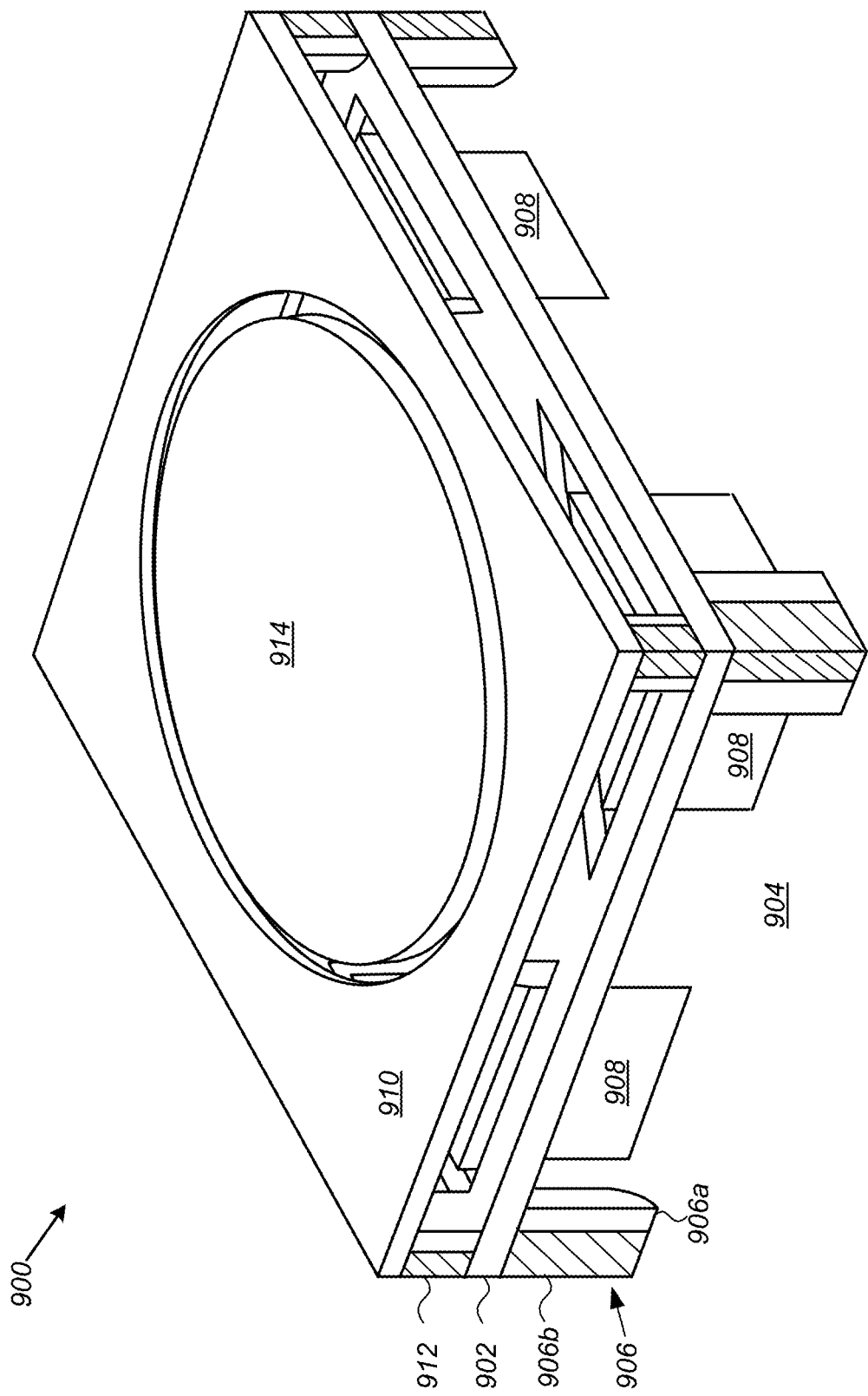
Figure 9C:
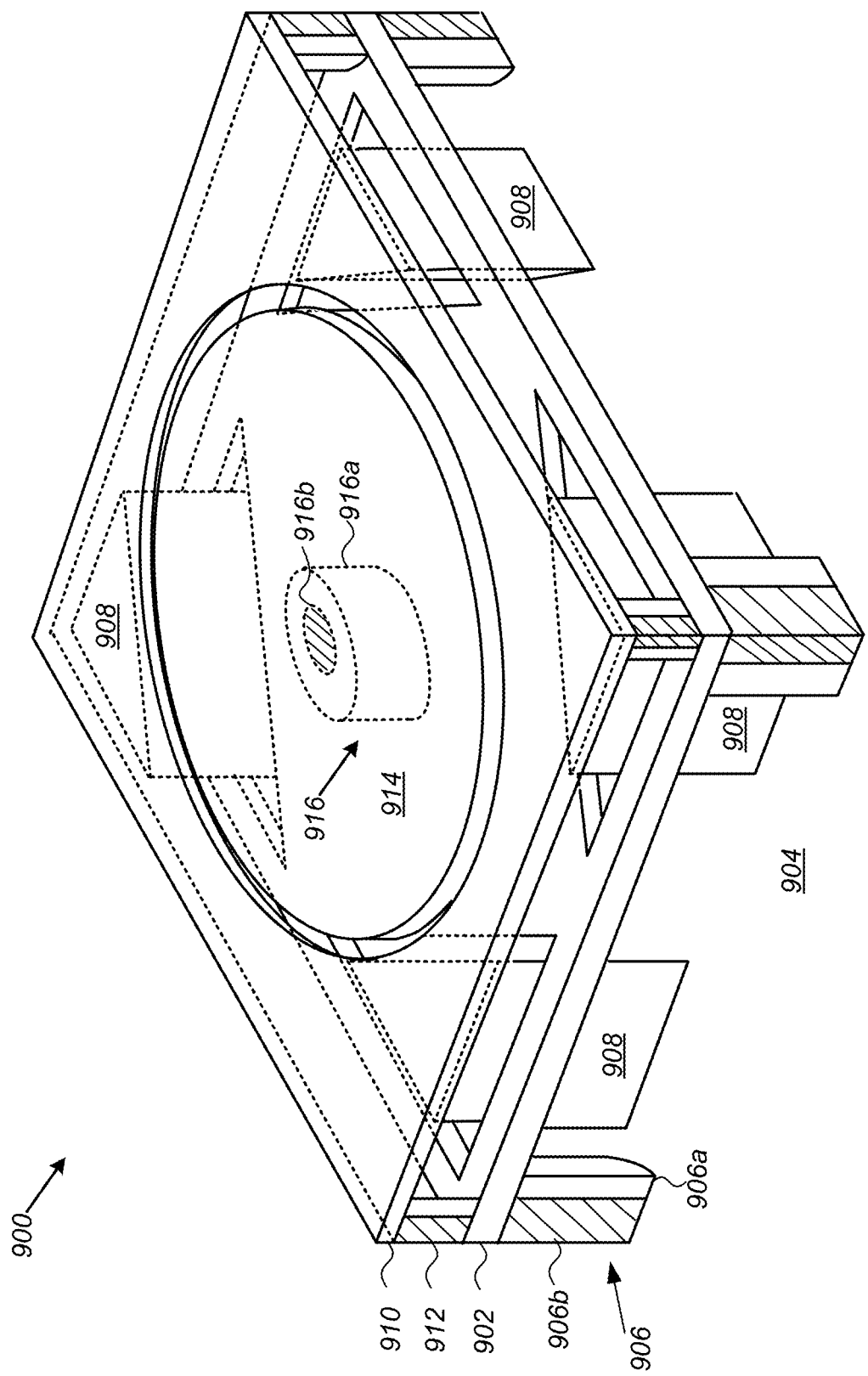

In another embodiment, the thermal conductivity or transfer of heat away from a MEMS-based SLM can be increased, and the reliability and lifetime of the SLM enhanced by the inclusion of thermal sinking structures in the modulators. FIGS. 9A-9C are perspective views of a lower MEMS or piston layer of a PLV™ modulator including large, thermal sinking structures filling previously void areas according to an embodiment of the present disclosure. In particular, FIG. 9A is a perspective view of a first MEMS or piston layer 902 of an incomplete PLV™ 900 suspended above a substrate 904 by a number of posts 906 in corners thereof, and including large, thermal sinking structures 908 substantially filling previously void areas in the piston layer to provide thermal management of the piston layer. The piston layer 902 includes an electrostatically deflectable piston 902a and a number of flexures 902b through which the piston is flexibly or movably coupled to the posts 906. The posts 906 can include an annular structure including an outer or first material 906a surrounding either a substantially hollow inner region or, as shown, a second material 906b. The first and second materials of the posts 906 can include a dielectric, conductive, or semiconductor material, selected to be compatible with the material and processes used to form the PLV™. Generally, at least one of the first or second materials of at least one of the posts 906 includes a conductive or semiconductor material to electrically couple an electrode (not shown in this figure) in or on the piston 902a to integrated drive circuitry (not shown in this figure) formed in or electrically coupled to the substrate 904.

In the embodiment shown in FIG. 9A the thermal sinking structures 908 include ends or upper surfaces substantially co-planar with an upper surface of the piston layer 902, and which do not extend substantially through or past the piston. The thermal sinking structures 908 can include a solid, homogeneous structure or an annular structure including an outer or first material 908a surrounding either a substantially hollow inner region or a second material 908b, as shown in FIG. 9D. The first and second materials of the thermal sinking structures 908 can include a dielectric, conductive, or semiconductor material. In one embodiment, the thermal sinking structures 908 include SiGe surrounding a core of Ge. An outer or first material 908a including SiGe is desirable as providing resistance to etchants used in forming the PLV™, while also providing a conductive path to electrically couple an electrode in or on the piston 902a to integrated drive circuitry in or electrically coupled to the substrate 904. The annular structure of the thermal sinking structures 908 is desirable as enabling the thermal sinking structures to have a large outer surface area, substantially filling void spaces between the posts 906, the flexures 902b and the piston 902a of the piston layer 902, without requiring excessive deposition of a conformal layer of the first material of the of the thermal sinking structures. As explained in further detail below this is particularly advantageous when the first material of the first material 908a of the thermal sinking structures 908 is deposited in a single step concurrent with, for example forming the piston layer 902 and or the posts 906. In some embodiment, such as that shown in FIG. 9D, the inner core or region of the thermal sinking structures 908 is not hollow, but is filled with a second material 908b, such a germanium (Ge) having an greater thermal conductivity than the first material 908a. Silicon-germanium (SiGe) has a thermal conductivity, depending on the ratio of silicon to germanium of from about 0.089 W/cm-° C. to about 0.11 W/cm-° C., while germanium (Ge) has a thermal conductivity of about 0.6 W/cm-° C. As explained in further detail below germanium (Ge) is also suitable as a sacrificial material useful in forming the PLV™, thus eliminating the need for a separate deposition step to deposit the second material 908b. It is further noted that use of Ge as a sacrificial material also enables easy replacement of void while easily maintaining planarity of a second sacrificial layer.

FIG. 9B is a perspective view of a complete PLV™ similar in structure to that of FIG. 9A and further including a second MEMS or faceplate layer 910 including a reflective top surface suspended above the piston layer 902 by second posts 912 and a mirror 914 formed either on or above and attached to the piston 902a of the piston layer. As with the first posts 906, the second posts 912 can include an annular structure including an outer or first material surrounding either a substantially hollow inner region or, as shown, a second material. As in PLVs™ described above, in the embodiment shown in FIG. 9B the mirror is substantially co-planar with an upper surface of the faceplate layer 910 when the PLV™ is in a quiescent or unpowered state and the piston 902a is not deflected. However, it will be understood that this placement of the mirror 914 in the state can be changed without changing or adversely impacting the structures and methods of the present invention. In particular, it is noted that mirror 914 can be positioned above or below the reflective top surface of the faceplate layer 910 by an even or odd multiple of one quarter (¼) wavelength of light modulated by the PLV™ to provide either constructive or destructive interference with light reflected from the reflective top surface of the faceplate layer and/or to modulate a phase of the reflected light. In the embodiment shown in FIG. 9A the thermal sinking structures 908 include ends or upper surfaces which terminate proximal to the faceplate layer 910 to provide thermal management of the faceplate layer as well as improved thermal management of the piston layer of the PLV™.

FIG. 9C is a see through, perspective view of the PLV™ including a faceplate layer 910 suspended above the piston layer 902 (shown in phantom), suspended above the surface of the substrate 904 by posts 912 in four corners of the PLV™, and including large, thermal sinking structures 908 extending through or past the piston layer to terminate proximal to or in contact with a faceplate. The thermal sinking structures 908 can include an annular-ring shape comprising first and second materials. It is further noted that this design, i.e., a post having an annular-ring shaped cross-section, can also be applied to the posts 906, 912 at the four corners of the PLV™.

FIG. 9C also illustrates a central post 916 (shown in phantom) supporting the mirror 914 above the piston layer 902, and, optionally, to provide thermal management of the mirror. In the embodiment, shown the central post 916 has an annular-ring shaped cross-section including an annular-ring of first material 916a surrounding either a substantially hollow inner region or an inner core of a second material 916b. As with the thermal sinking structures 908, the first and second materials of the central post 916 can include a dielectric, conductive, or semiconductor material. In one embodiment, the central post 916 includes SiGe surrounding a core of Ge. Previously, it was not possible enlarge the size of the posts 906, 912, without creating dimples on a surface of the faceplate layer 910, mirror 914 or piston layer 902. Thus, sizes of the posts 906, 912, 916 were limited by a thickness of the piston or mirror and faceplate layers in order to provide a smooth, substantially planar top surface.

A method for operating a MEMS-based SLM packaged in a MEMS package filled with a low molar mass and high thermal conductivity fill gas will now be described with reference to the flow chart of FIG. 10. Referring to FIG. 10, the method begins with providing a MEMS based SLM including reflective surfaces enclosed within a cavity of a package including an optically transparent cover (step 1002). Next, the cavity is filled with a low molar mass fill gas having an atomic number of two or less and a thermal conductivity of greater than 100 mW/(m·K), at a pressure of 0.1 atmosphere or greater (step 1004). In some embodiments, the cavity is filled with a low molar mass fill gas having a thermal conductivity of 151 mW/(m·K), at a pressure of 1 atmosphere. Optionally, a fluid flow is established the through cavity from an inlet and an outlet in the package (step 1006). The reflective surfaces are then exposed to a light beam through the optically transparent cover (step 1008). Again, optionally the method can further include monitoring pressure in the cavity during exposure of the reflective surface to the light beam (step 1010), and stopping exposure of the reflective surface to the light beam if the pressure drops below a specified minimum 0.1 atmospheres (step 1012).

Figure 11:
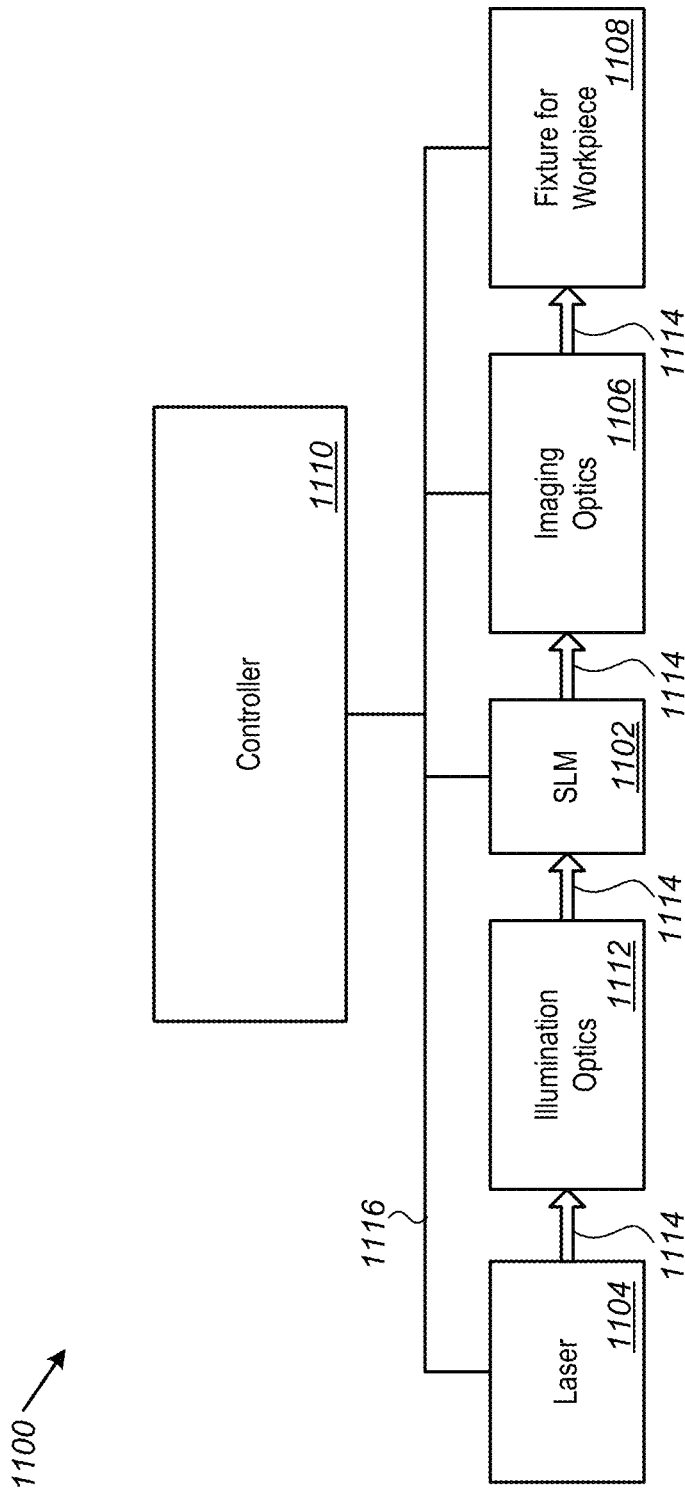
FIG. 11 is a block diagram of an optical system including a SLM including a linear array of MEMS based modulators enclosed in a package including a cavity filled with a low molar mass and high thermal conductivity fill gas.

FIG. 11 is a block diagram of an optical system 1100 including a SLM 1102 with a multi-pixel, linear array of MEMS-based modulators (not shown in this figure), such as shown in FIGS. 2A through 2C, or a multi-pixel, linear array of 2D modulators, such as shown in FIGS. 3A through 3C and FIG. 4. Briefly, the optical system 1100 includes, in addition to the SLM 1102, a light source, such as a laser 1104, operable to illuminate the SLM, imaging optics 1106 operable to focus a substantially linear swath of modulated light onto an imaging or focal plane, such as surface of a workpiece on a fixture 1108, and a controller 1110 operable to control the SLM, laser and imaging optics to scan the linear swath of modulated light across the surface of the workpiece to record a two-dimensional (2D) image thereon. Generally, as in the embodiment shown, the optical system 1100 further includes illumination optics 1112 with a beam forming optical system to direct a rectangular beam onto the linear array of the SLM 1102.

Typically, the laser 1104 is capable of operating in ultraviolet (UV) wavelengths of from 355 nanometers (nm) through infrared (IR) wavelengths up to about 2000 nm in either a continuous wave (CW) mode, or in a pulse mode with widths or durations of from about 1 femtoseconds (fs) up to about 500 nanoseconds (ns) at a repetition rate of from about 10 kHz up to about 300 kHz, and at energy ranges of from about 10 microjoules (μJ) up to greater than 10 millijoules (mJ).

The imaging optics 1106 can include dynamic optical elements, such as galvanometric mirrors, to scan the linear swath of modulated light across the surface of the workpiece, and a number of static optical elements to direct modulated light to the galvanometric mirrors and/or to focus the modulated light from the galvanometric mirrors onto the surface of the workpiece.

The fixture 1108 on which the workpiece is placed or affixed can include a static fixture, or a movable stage operable to move or reposition the workpiece relative to a substantially stationary linear swath of modulated light, to scan the linear swath of modulated light across the surface of the workpiece. In either embodiment, whether static or movable, the fixture 1108 preferably includes a number of sensors and signaling means to signal other components in the laser marking system when the workpiece is in proper position to be marked. In some embodiments, the fixture 1108 includes a movable stage capable of being moved along two orthogonal axes to enable scanning multiple parallel swaths to scan larger areas on the workpiece. In other embodiments, the optical system 1100 includes both imaging optics 1106 with galvanometric mirrors, and a movable stage (fixture 1108) capable of being moved along a single axis orthogonal to the direction the galvanometric mirrors scan the linear swath of modulated light to scan larger areas on the workpiece.

The laser 1104, illumination optics 1112, SLM 1102, imaging optics 1106 and workpiece held on the fixture 1108 are optically coupled in the direction indicated by arrows 1114. Additionally, the laser 1104, illumination optics 1112, SLM 1102, imaging optics 1106 and fixture 1108 are electrically coupled in signal communication with the controller 1110 and each other through a control bus 1116. In particular, controller 1110 provides digital image data to the SLM 1102, controls a power level of the laser 1104, controls operation of galvanometric mirrors in the imaging optics 1106 and controls the movable stage of the fixture 1108 (where included) through the control bus 1116. Additionally, the fixture 1108 can signal the controller 1110, SLM 1102 and/or the laser 1104 when the workpiece is in proper position, and the SLM can signal the laser when the image data loaded to the SLM is ready to be scanned on the workpiece so that the laser can be pulsed.

Figure 12:
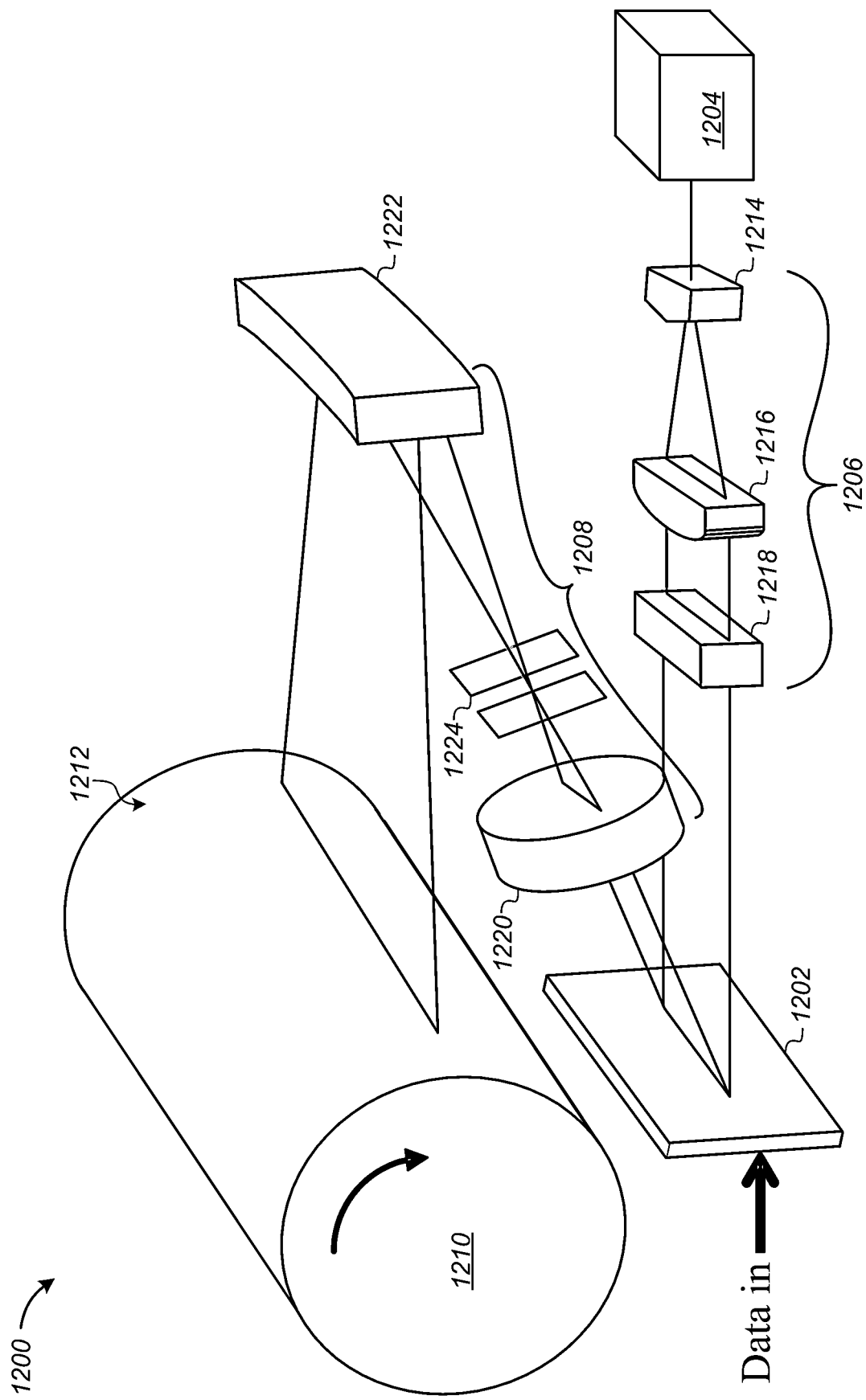
FIG. 12 is a schematic block diagram of a layout for a thermal, computer-to-plate (CtP) printing system including a SLM including a linear array of MEMS based modulators enclosed in a package including a cavity filled with a low molar mass and high thermal conductivity fill gas.

FIG. 12 is a schematic block diagram of a layout for a thermal, computer-to-plate (CtP) printing system including a SLM having a linear array of MEMS based modulators enclosed in a package including a cavity filled with a low molar mass and high thermal conductivity fill gas. Referring to FIG. 12, a printing system or printer 1200 including a SLM 1202 having a linear array of MEMS based modulators, such as shown in FIGS. 2A through 2C, or a multipixel, linear array of 2D modulators, such as shown in FIGS. 3A through 3C and FIG. 4, is shown in FIG. 12. An advantage of using the SLM 1202 having a linear array of MEMS based modulators in this application is that it eliminates the need for a scanning mirror and f-Ө or scanning optics of conventional SLM by replacing them with the SLM 1202 having a linear array of MEMS based modulators sufficiently large along a longitudinal axis to project modulated light over a swath extending substantially across the entire width of an imaging or focal plane. The printer 1200 generally comprises an illuminator or light source 1204, illumination optics 1206, and imaging optics 1208 to direct an image (modulated light) from the SLM 1202 onto a photosensitive or photoconductive surface of the imaging or focal plane, shown here as a drum 1210 with a photoconductive layer on a surface 1212 thereof.

The light source 1204 can include any light emitting device capable of continuously emitting light at a sufficient power level or power density, and, preferably at a single or narrow range of wavelengths to enable light reflected from modulators of the SLM 1202 to be modulated in phase and/or amplitude by diffraction. In certain printing applications, and in particular in photothermal printers, the light source 1204 can include a number of lasers or laser emitters, such as diode lasers, each powered from a common power supply (not shown) in a CW (Continuous Wave) operation. Preferably, the light source 1204 is a high-power diode laser producing from about 5000 to about 40,000 milliwatts (mW) of power at a wavelength ($\lambda$) of from about 750 to about 1000 nm.

The illumination optics 1206 can comprise a number of elements including lens integrators, mirrors and prisms, designed to transfer light from the light source 1204 to the SLM 1202 such that a line of a specified length and width is illuminated on the SLM. In the embodiment shown, the illumination optics 1206 include a prism 1214 and lens 1216 to refract and transmit light from the light source 1204, and an integrator 1218 to illuminate a swath covering substantially the full width of the SLM.

The imaging optics 1208 can include magnification elements, such as a Fourier Transform (FT) lens 1220 and a FT mirror 1222, to direct the light from the SLM 1202 to the photoconductive layer located on the drum 1210. Preferably, the imaging optics 1208 is designed to transfer light from the SLM 1202 to the drum 1210 such that a photoconductive layer located on the drum is illuminated across a swath covering substantially the full width of the drum. Optionally, as in the embodiment shown, the imaging optics 1208 further includes filter elements, such as a FT filter 1224, to resolve light reflected from each pixel but not light reflected from each individual modulator or diffractor or from each element in each modulator.

As described above with reference to FIGS. 3A-C and 4, the SLM 1202 includes a linear array of a number of individual diffractive two-dimensional (2D) densely packed spatial light modulators or diffractors (not shown in this figure). Adjacent 2D modulators may be grouped or functionally linked to provide a number of pixels in the linear array that can be controlled by drive signals from a single, common drive channel to print to the imaging or focal plane with a desired resolution. Preferably, the SLM 1202 has a pixel count adequate to cover a swath or strip extending substantially across the entire width of the photo or thermal-sensitive surface of the imaging or focal plane. More preferably, the SLM 1202 has a pixel count of at least about 500 pixels, and most preferably of at least about 1000 pixels to provide the desired resolution. For example, in one version of the layout illustrated in FIG. 12, the SLM 1202 includes a sufficient number of pixels to cover an entire swath on a standard eight inch (8") write drum 1210 with a printing resolution of about 2000 dots-per-inch (dpi) using a modest-power, 780 nm GaAs diode laser as the light source 1204.

In another embodiment, not shown, the printing system is a maskless lithography or photolithography system including the SLM and further comprising a pattern generator to generate and transmit to the number of 2D modulators drive signals to manufacture micro-electronic devices. By micro-electronic devices it is meant integrated circuits (ICs) and Micro-Electromechanical System or MEMS devices. In maskless lithography, light used to expose the photosensitive material in an image plane on a substrate, such as silicon or semiconductor wafer, on which the device is to be formed.

Figure 13:
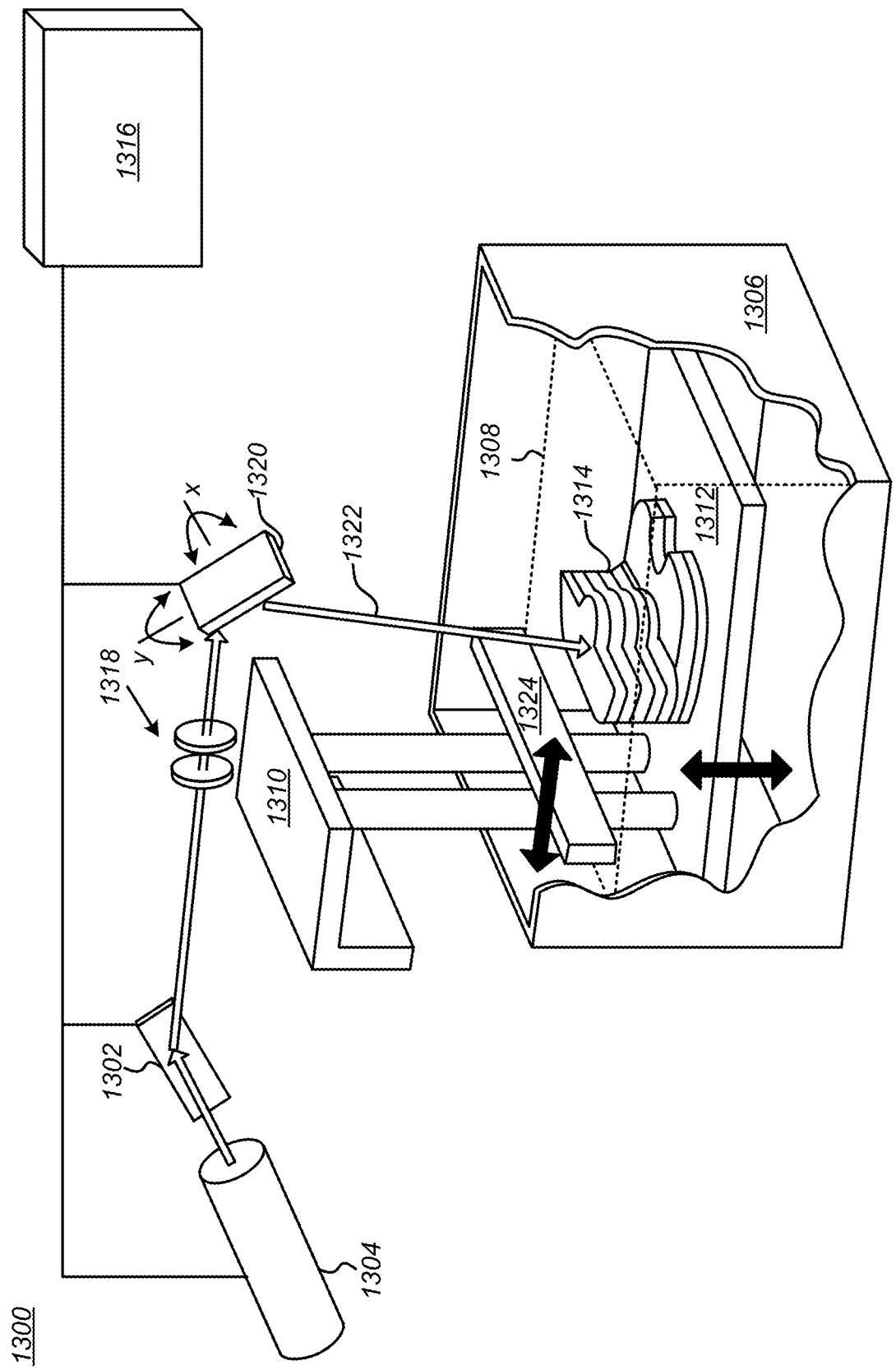
FIG. 13 is a schematic block diagram of an additive manufacturing system including a SLM including a linear array of MEMS based modulators enclosed in a package including a cavity filled with a low molar mass and high thermal conductivity fill gas.

FIG. 13 is a schematic block diagram of a three-dimensional (3D) printing or additive manufacturing system including a SLM enclosed in a package including a cavity filled with a low molar mass and high thermal conductivity fill gas. Referring to FIG. 13, the 3D printing system 1300 generally includes a MEMS-based diffractive SLM 1302 with a number of pixels, each with multiple modulators to modulate a beam of light generated by a laser 1304, a vat 1306 containing the photopolymer or resin 1308 (indicated by dashed lines), and a transport mechanism 1310 to raise and lower a work surface 1312 on which an object 1314 is printed into the vat as indicated by the vertical arrow. The laser 1304 is capable of operating in UV wavelengths ($\lambda$) of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules ($\mu J$) up to greater than 10 millijoules (mJ).

Referring again to FIG. 13, the 3D printing system 1300 further includes imaging optics 1318 to transfer modulated light from the SLM toward the work surface 1312, a controller 1316 to control operation of the laser 1304, SLM 1302 and transport mechanism 1310. In some embodiments, the imaging optics 1318 can include magnification and filtering elements, such as a first Fourier Transform (FT) lens to focus and direct light from the SLM 1302 onto a scanning mirror 1320 that rotates to scan a modulated beam 1322 along a x-axis and a y-axis on a surface of the resin 1308 immediately above or adjacent to the work surface 1312.

The transport mechanism 1310 is adapted and controlled by the controller 1316 to lower the work surface 1312 into the vat 1306 as the modulated light converts the liquid resin 1308 into a solid, building successive layers or cross-sections of the object 1314 to be printed. Generally, the 3D printing system 1300 further includes a sweeper 1324 adapted to move as indicated by the horizontal arrow to spread or smooth fresh resin 1308 over surface sections of the object 1314 being printed.

Figure 14:
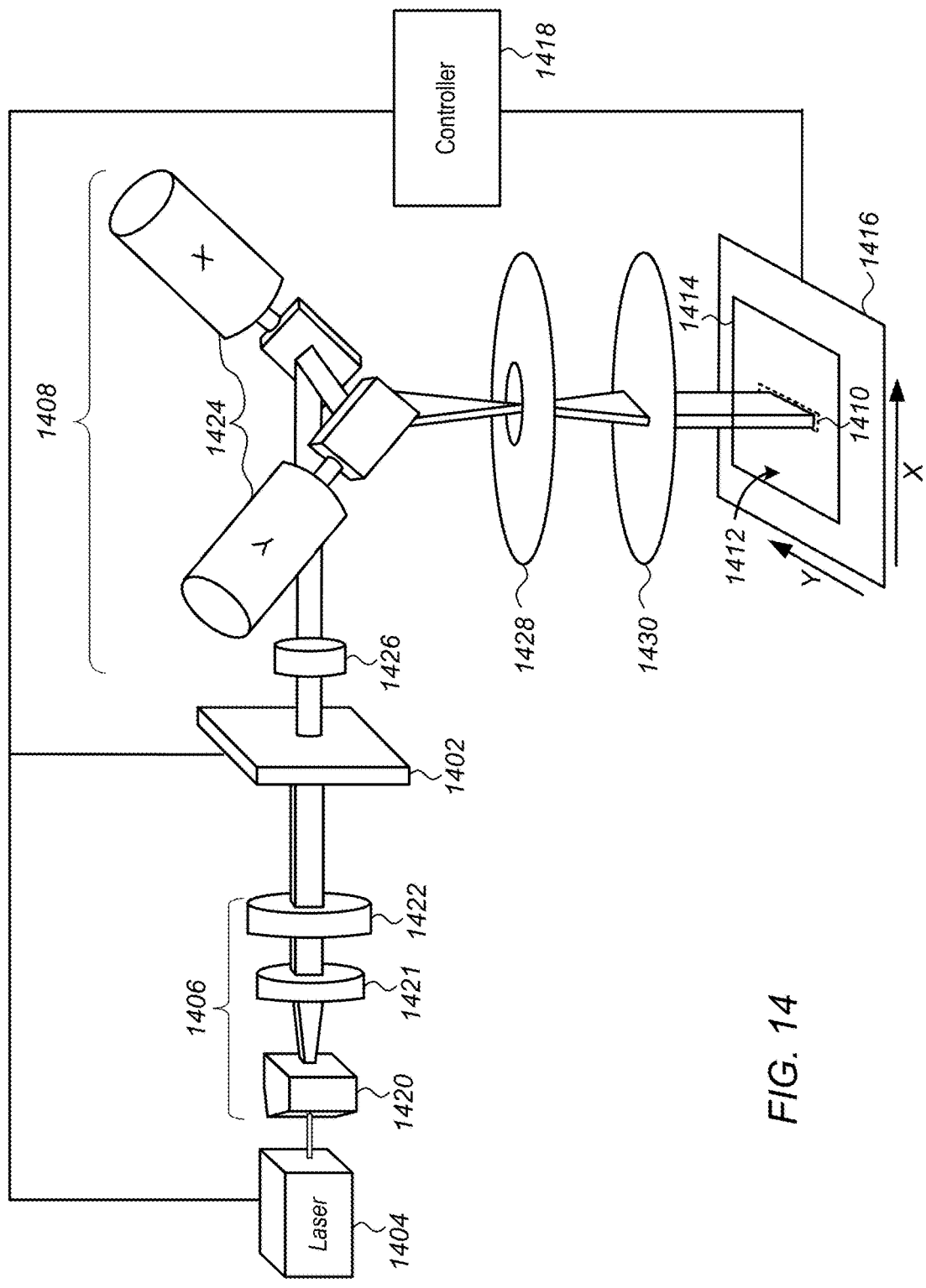
FIG. 14 is a schematic block diagram of an embodiment of a surface modification system including a SLM including a linear array of MEMS based modulators enclosed in a cavity filled with a low molar mass and high thermal conductivity fill gas.

FIG. 14 is a schematic block diagram of an embodiment of a laser marking system including a SLM enclosed in a cavity filled with a low molar mass and high thermal conductivity fill gas. FIG. 14 is a schematic block diagram of an embodiment of a laser marking system 1400 including a SLM 1402 with a multi-pixel, linear array of MEMS based modulators, and galvanometric mirrors for scanning. For purposes of clarity and to simplify the drawings the optical light path is shown as being unfolded causing the SLM 1402 to appear as transmissive. However, it will be understood that because the SLM 1402 is reflective the actual light path is folded to an angle of 90° or less at the SLM.

Referring to FIG. 14, the laser marking system 1400 includes, in addition to the SLM 1402, a laser 1404 operable to generate laser light used to illuminate the SLM, illumination optics 1406 to direct laser light onto the SLM, imaging optics 1408 operable to focus a substantially linear swath of modulated light 1410 onto a surface 1412 of a workpiece 1414 on or affixed to a fixture 1416 or stage, and a controller 1418 operable to control the SLM, laser and imaging optics to scan the linear swath of modulated light across the surface of the workpiece to record a 2D image thereon. The laser 1404 is capable of operating in UV wavelengths ($\lambda$) of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules ($\mu$J) up to greater than 10 millijoules (mJ).

The SLM 1402 can include a multi-pixel; linear array of MEMS based, ribbon-type modulators, such as shown in FIGS. 2A through 2C, or a multi-pixel, linear array of 2D modulators, such as shown in FIGS. 3A through 3C and FIG. 4.

The illumination optics 1406 can include a beam forming optical system to direct laser light onto the SLM 1402. Referring to FIG. 14, elements of the beam forming optical system can include a Powell lens 1420, a long axis collimating lens 1421, and a cylindrical, short axis focusing lens 1422 to shape or focus the illumination into a rectangular beam or line of illumination extending substantially uniformly across the linear array of the SLM 1402.

The imaging optics 1408 can include galvanometric mirrors 1424 to scan the linear swath of modulated light 1410 across the surface 1412 of the workpiece 1414, a number of cylindrical lens 1426 to direct modulated light to the galvanometric mirrors, and a Fourier aperture 1428 to separate a $0^{th}$ order beam in the modulated light from $1^{st}$ order beams, and a Fourier Transform (FT) lens 1430 to focus the modulated light onto the surface of the workpiece.

Preferably, the cylindrical lens 1426 and FT lens 1430 of the imaging optics include fused silica lenses to reduce thermal focus shift of the modulated light focused onto the surface 1412 of a workpiece 1414. In some embodiments, one or more of the lenses 1420, 1421, 1422 of the illumination optics 1406 can also include fused silica lenses to reduce thermal focus shift of the laser light focused onto the SLM 1402.

The fixture 1416 on which the workpiece 1414 to be marked is placed or affixed can include a static fixture, or a movable stage operable to move or reposition the workpiece relative to a substantially stationary linear swath of modulated light, to scan the linear swath of modulated light across the surface of the workpiece. As noted above, in either embodiment, whether static or movable, the fixture 1416 preferably includes a number of sensors and signaling means to signal other components in the laser marking system when the workpiece is in proper position to be marked.

Depending on the size of the linear swath of modulated light 1410 and/or an image to be recorded it can be recorded on the surface 1412 of a workpiece 1414 in a single scan or single-stripe of the linear swath of modulated light 1410 across the surface along a single axis, or by multiple scans or stripes (multi-stripes) of the linear swath of modulated light across the surface along a first axis perpendicular to a long axis of the linear swath of modulated light, followed by repositioning the linear swath of modulated light along a second axis parallel to the long axis of the linear swath.

FIG. 15A is a schematic diagram of a Light Detection and Ranging (LiDAR) system including a SLM enclosed in a cavity filled with a low molar mass and high thermal conductivity fill gas. FIG. 15 is a schematic functional diagram of a portion of a LiDAR system 1500 including controller 1501 and a solid state optical scanner 1502 having an optical transmitter 1504 with at least one MEMS phased-array 1506 enclosed in a cavity filled with a low molar mass and high thermal conductivity fill gas, and configured to receive light from a light source through shaping or illumination optics (not shown in this figure), and to modulate phases of at least some of the received light and transmit or project a beam of phase modulated light through projection optics 1508 operable to project and steer a line or swath 1510 of illumination to scan a far field scene 1512. The MEMS phased-array 1506 steers the beam of light to scan the far field scene 1512 by changing phase modulation of light incident on different portions of the MEMS phased-array. Generally, the first MEMS phased-array 1506 is configured to scan the far field scene 1512 in at least two-dimensions (2D), including an angular dimension ($\theta$), and an axial dimension (indicated by arrow 1514) parallel to a long axis of the MEMS phased-array.

It is noted that although the optical scanner 1504 is shown schematically as including a single MEMS phased-array 1506 this need not and generally is not the case in every embodiment. Rather, as explained in detail below, it is often advantageous that the optical scanner 1504 include multiple adjacent MEMS phased-arrays 1506 operated in unison or a single MEMS phased-array having multiple adjacent arrays to increase either aperture width or length to increase a power or radiant flux of the transmitted or received light and to increase the point spread resolution of the system.

The optical scanner 1504 further includes an optical receiver 1516 including collection or receiving optics 1518 to capture light from the far field scene 1512, which is then directed onto a detector 1520.

Referring to FIG. 15, depth or distance information from the LiDAR system 1500 to a target or object 1522 in the far field scene 1512 can be obtained using any one of a number of standard LiDAR techniques, including pulsed, amplitude-modulated-continuous-wave (AMCW) or frequency-modulated-continuous-wave (FMCW). In pulsed and AMCW LiDAR systems the amplitude of intensity of the light transmitted is either pulsed or modulated with a signal, and the TOF from the LiDAR system 1500 to the object 1522 is obtained by measuring the amount by which the return signal is time-delayed. The distance to the reflected object is found by multiplying half this time by the speed of light.

FIG. 15B is a diagram illustrating a change in frequency of an outgoing pulse of transmitted light over time for a LiDAR system using an FMCW technique. Referring to FIGS. 15A and 15B, in a FMCW LiDAR the frequency of an outgoing chirp or pulse 1524 of transmitted light is continuously varied over time as the swath 1510 of light is continuously scanned across the far field scene 1512. The time to the object 1522 can be determined by comparing the frequency of light reflected from the object to that of a local oscillator, and the distance to the object is found by using the speed of light as previously described. FMCW LiDAR systems have an advantage over amplitude modulated in that the local oscillator provides an inherent amplification of the detected signal.

With information on TOF the controller 1501 in the LiDAR system can then calculate a location of the object 1522 in the far field scene 1512 along an X-axis 1526 from the steering direction of the MEMS phased-array 1506 when the light was transmitted from the MEMS phased-array, and along a Y-axis 1528 from a sensed location of the object along an axis of the detector 1520 (indicated by arrow 1530) parallel to a long axis of the detector.

Thus, embodiments of a MEMS based SLMs enclosed in helium filled MEMS packages, and methods for fabricating and operating the same in various applications have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A spatial light modulator (SLM) comprising:
a number of Microelectromechanical System (MEMS) modulators, each modulator comprising a number of light reflective surfaces including at least one light reflective surface coupled to an electrostatically deflectable element suspended above a surface of a substrate, and each modulator adapted to reflect and modulate a light beam incident thereon; and a package enclosing the number of MEMS modulators, the package comprising a cavity in which the number of MEMS modulators are enclosed, an optically transparent cover through which the number of reflective surfaces are exposed to the light beam, and an inlet to the cavity, wherein the inlet is coupled to a gas supply and is operable to provide in the cavity a low molar mass fill gas having an atomic number of two or less and a thermal conductivity of greater than 100 milliwatts per meter kelvin (mW/(m·K), and to maintain a pressure of 0.1 atmospheres or greater when the SLM is operated to modulate the light beam.

2. The SLM of claim 1 wherein the fill gas comprises from 10 to 100% hydrogen (H) or helium (He).

3. The SLM of claim 2 wherein the fill gas comprises a mixture of hydrogen (H) or helium (He).

4. The SLM of claim 1 wherein the package further comprises an outlet operable to provide a flow of gas of from 0.01 Standard Cubic Centimeters per Minute (sccm) to 10000 sccm during operation of the SLM.

5. The SLM of claim 1 wherein each of the number of MEMS modulators comprises a number of electrostatically deflectable ribbons suspended over the surface of the substrate, each ribbon having a light reflective surface, wherein electrostatic deflection of the number of electrostatically deflectable ribbons brings light reflected from the light reflective surface of a first electrostatically deflectable ribbon into interference with light reflected from the light reflective surface of a second electrostatically deflectable ribbon.

6. The SLM of claim 1 wherein each of the number of MEMS modulators comprises a two-dimensional (2D) MEMS modulator including:
a piston layer suspended over the surface of the substrate by posts at corners thereof, the piston layer including an electrostatically deflectable piston and a number of flexures through which the piston is coupled to the posts;
a first reflective surface over a top surface of the piston; and
a faceplate suspended over the piston layer, the faceplate including a second reflective surface on a top surface of the faceplate, and an aperture through which the piston exposed,
wherein electrostatic deflection of the piston brings light reflected from the first reflective surface into interference with light reflected from the second reflective surface.

7. The SLM of claim 6 wherein the 2D MEMS modulators are arranged as a linear array.

8. The SLM of claim 1 wherein the number of MEMS modulators are operable to modulate one or both of a phase and an amplitude of light incident thereon.

9. A system comprising:
a light source operable to generate a light beam;
a spatial light modulator (SLM) operable to modulate light incident thereon, the SLM including a multi-pixel, linear array of MEMS modulators, the SLM enclosed in a cavity in a package with an optically transparent cover through which the linear array of MEMS modulators are exposed to the light beam, the cavity filled a fill gas comprising from 10 to 100% hydrogen (H) or helium (He);
imaging optics operable to focus modulated light from the SLM onto a focal plane of the system;

a controller operable to control the light source, the SLM, and the imaging optics to scan the modulated light across the focal plane, and a fill gas source coupled to a fill gas inlet on the package of the SLM to provide fill gas to the cavity, and wherein the controller is further operable to control the fill gas source to maintain a pressure of 0.1 atmospheres or greater during operation of the SLM.

10. The system of claim 9 further comprising fill gas outlet on the package of the SLM, and wherein the controller is further operable to control the fill gas source to provide a flow of gas of from 0.01 Standard Cubic Centimeters per Minute (sccm) to 10000 sccm during operation of the SLM.

11. The system of claim 9, wherein the system is an additive manufacturing system further comprising:
a vat into which material being added together is introduced; and
a transport mechanism to raise and lower a work surface, on which an object is to be manufactured into the vat, wherein the focal plane is on a surface of the material in the vat, and wherein the controller is further operable to control operation of the transport mechanism.

12. The system of claim 9, wherein the system is a surface modification system, the focal plane is on a surface of a workpiece, the light source is a laser, and wherein the imaging optics is operable to focus a substantially linear swath of modulated light onto the surface of the workpiece, the linear swath comprising light from multiple pixels of the SLM, and wherein the controller is operable to control the SLM, laser and imaging optics to mark the surface of the workpiece to record an image thereon.

13. The system of claim 9, wherein the system is a light detection and ranging (LiDAR) system, the focal plane is far field scene, the light source is a coherent light source, the imaging optics are operable to project light from the SLM to the far field scene, and further comprising receiving optics to receive light from the far field scene and direct received light onto a detector.

14. A method comprising:
providing a Micro-Electromechanical System (MEMS) based spatial light modulator enclosed within a cavity of a package comprising an optically transparent cover through which reflective surfaces of the MEMS based SLM are exposed, and an inlet to the cavity; and
coupling the inlet to a fill gas source and filling the cavity with a low molar mass fill gas having an atomic number of two or less and a thermal conductivity of greater than 100 milliwatts per meter kelvin (mW/(m·K);

operating the fill gas source to maintain a pressure of 0.1 atmospheres or greater during operation of the MEMS based spatial light modulator; and
exposing the reflective surfaces to a light beam.

15. The method of claim 14, wherein filling the cavity comprises pressurizing the cavity with fill gas comprising from 10 to 100% hydrogen (H) or helium (He) at a pressure of 1 atmospheres or greater.

16. The method of claim 14 wherein the package further comprises an outlet, and wherein filling the cavity comprises providing a flow of gas though the cavity from the inlet to the outlet of from 0.01 Standard Cubic Centimeters per Minute (sccm) to 10000 sccm during operation of the SLM.

17. The method of claim 14 further comprising discontinuing exposing the reflective surfaces to the light beam if pressure decreases to less than 0.1 atmospheres.

18. The SLM of claim 6 wherein each of the number of MEMS modulators further comprises a plurality of thermal sinking structures projecting from the surface of the substrate and extending through void spaces between the posts, the number of flexures and the piston of the piston layer to improve thermal management of the piston layer.

19. The system of claim 9, wherein each of the MEMS modulators comprises a two-imensional (2D) MEMS modulator including:
a piston layer suspended over the surface of the substrate by posts at corners thereof, the piston layer including an electrostatically deflectable piston and a number of flexures through which the piston is coupled to the posts;
a plurality of thermal sinking structures projecting from the surface of the substrate and extending through void spaces between the posts, the number of flexures and the piston of the piston layer to improve thermal management of the piston layer;
a first reflective surface over a top surface of the piston; and
a faceplate suspended over the piston layer, the faceplate including a second reflective surface on a top surface of the faceplate, and an aperture through which the piston exposed,
wherein electrostatic deflection of the piston brings light reflected from the first reflective surface into interference with light reflected from the second reflective surface.

* * * * *